United States Patent [19]

DeWitte

[11] 4,276,644

[45] Jun. 30, 1981

[54] TESTER AND METHOD FOR CHECKING METER ENCODERS IN AUTOMATIC METER READING SYSTEMS

[75] Inventor: Gordon J. DeWitte, Los Alamos, N. Mex.

[73] Assignee: General Electric Company, Somersworth, N.H.

[21] Appl. No.: 890,924

[22] Filed: Mar. 28, 1978

[51] Int. Cl.³ ............................................. G06F 11/00
[52] U.S. Cl. ................................ 371/25; 340/347 P; 340/870.22; 179/2 AM
[58] Field of Search ................ 179/2 AM; 340/347 P, 340/203–206; 371/25, 57, 67, 69

[56] References Cited

U.S. PATENT DOCUMENTS

| | | | |
|---|---|---|---|
| 3,846,789 | 11/1974 | Germer | 340/347 P |
| 4,037,219 | 7/1977 | Lewis | 340/204 |
| 4,173,752 | 11/1979 | Yamanaka | 371/57 |
| 4,183,014 | 1/1980 | McClean | 340/204 |

Primary Examiner—Charles E. Atkinson
Attorney, Agent, or Firm—Robert E. Brunson

[57] ABSTRACT

Apparatus for use in an automatic meter reading system for displaying meter encoder generated dial readings and detecting errors in response to information contained in the encoder meter dial readings. Errors are detected through interdial checking by comparing the angular positions of adjacent dial drive gears. When the angular positions of adjacent gears are not in the proper mechanical, or angular relationship an error is recorded.

10 Claims, 13 Drawing Figures

REPRESENTATIVE ENCODER DATA MESSAGE

TESTER AND METHOD FOR CHECKING METER ENCODERS IN AUTOMATIC METER READING SYSTEMS

BACKGROUND OF THE INVENTION

The present invention relates generally to encoder reader testers and more particularly to a reader tester for reading message information generated by an encoder in a meter of an automatic meter reading system to test to see if the meter dial readings in the message from the encoder correspond to the actual dial readings on the face of the meter.

Systems for automatically reading residential electric, gas and water meters from a central location have come into commercial reality in the last few years. A basic automatic meter reading system consists of three parts or functions: an encoder mounted within a meter, a communication system, and a reading center. The encoder provides the means of converting a mechanical meter reading from a meter into a form suitable for communicating, via the communication system, to the reading control center. One of the prime requirements in this type of system is that the encoder meter information transmitted over the communication system be error free. The reason for this is because the automatic meter reading will be used to acquire data for billing the consumption of electrical energy, gas, water and the like. For years the established standard for accuracy and reliability in a utility meter has been in the meter at the consumer's residence or place of business. This standard is generally trusted by the consumer, the public utility and the public utility commission and the information displayed on the meter register or index of the meter is accepted as a true and accurate record of consumption. In order to obtain this established trust by consumers and the public utility commissions, the on-site visual display of consumption must ideally be retained. Secondly, in an automatic meter reading system, the automatic reading must agree with the visual display and there must be a high degree of assurance that the automatic meter reading will agree with the visual display without the need for actually confirming the automatic meter reading with periodic readings of the visual display.

It is recognized that it is not just enough to simply encode the meter reading and expect that the visual display and the automatic reading will always be the same—encoding equipment will malfunction, therefore there will be errors. Thus, what is required is an encoder reader and tester apparatus for supporting automatic meter reading systems which can detect for encoder errors and also detect for the valid operation of the encoder. One known meter capable of generating coded output information from an encoder is disclosed in U.S. Pat. No. 3,846,789 entitled "Remote Reading Register with Error Detecting Capability" assigned to the assignee of the present invention. In that patent, a novel remote reading register comprises an encoding mechanism which has the capability to resolve ambiguity in formulating an encoded message representative of the dial readings on the register indicators, and having in addition thereto, the capability of providing encoded information which may be utilized to detect the transmission of erroneous and non-erroneous encoded messages. Utilizing the data transmitted by the encoder of that patent, there is a high degree of assurance that an accepted reading at the remote location, such as a reading control center, is in fact precisely the same as would be a visual reading taken directly from the dial indicators on the face of the meter at the meter location.

In the aforementioned patent, it is disclosed that the meter reading information generated by the encoder register can be utilized to determine the decimal dial readings and further to check for encoding errors which are contained in the meter dial information transmitted by the encoder. A conventional decade mechanical gear train is utilized to drive a kilowatt-hour register comprised of five dials. Further, each shaft has a dial drive gear and also contains a slotted optical encoding disc which is rotatable by a motor to generate pulse code digital information representative of the decimal dial reading of each dial on the meter. The detection of errors is an encoder meter of the type disclosed in the aforementioned patent, is referred to therein as interdial checking and is based on the following principle: each gear in a mechanical gear train has a definite and positive mechanical relationship to the other gears in the train. If the angular position of one gear is known, other gears in the train are restricted to certain angular positions relative to the known gear. By establishing certain known angular positions of the relationships of the gears, it is possible to accurately determine the true dial reading of each dial by comparing the interdial readings between the gears in the meter encoder. It is recognized in this patent that the encoder information can be used for interdial checking of errors in the encoder message, however no known reader tester apparatus is known to exist for accurately testing the operation of encoders of the type disclosed. Therefore, a need exists for an encoder reader tester apparatus capable of interrogating a meter encoder and detecting errors in messages generated by the encoder.

SUMMARY OF THE INVENTION

The novel encoder reader tester, in accordance with the present invention, comprises means for reading encoded meter information and performing an interdial check between adjacent dial drive gears or readings of a meter to detect for erroneous encoded messages when the angular relationships between adjacent encoded gears are not within prescribed positions. Utilizing the meter dial information from the encoder, which contains a high degree of measurement resolution of the dial readings, the remote reader tester of the present invention provides a high degree of assurance that an accepted reading at the meter location is in fact, precisely the same as would be a visual reading taken directly from the dial indicators on the face of the meter at the meter location.

Additionally, the novel reader tester of the present invention provides the capability of detecting for invalid messages and further provides an indication of a non-responsive encoder.

It is therefore an object of the present invention to provide a meter encoder reader tester having enhanced operating capabilities.

It is another object of the present invention to provide a reader tester for use in testing the operation of a meter encoder in an automatic meter reading system.

It is a further object of the present invention to provide a meter encoder tester for interdial checking of the angular positions between the mechanical gears of a gear driven register encoder to detect for inaccuracies in the encoder meter dial readings.

A still further object of the present invention is to provide apparatus for checking the operation of a remote meter encoder of the type used in automatic reading systems.

It is another object of the present invention to provide apparatus and a method of communicating with a remote meter and encoder to verify that the encoder is properly functioning and that meter dial reading information generated by the encoder corresponds to the visual dial indications on the meter dials.

BRIEF DESCRIPTION OF THE DRAWING

Other objects, features and advantages of the present invention will become more fully apparent from the following detailed description of the preferred embodiment, the appended claims and the accompanying drawing in which:

DESCRIPTION OF THE PREFERRED EMBODIMENT

Figure 1:
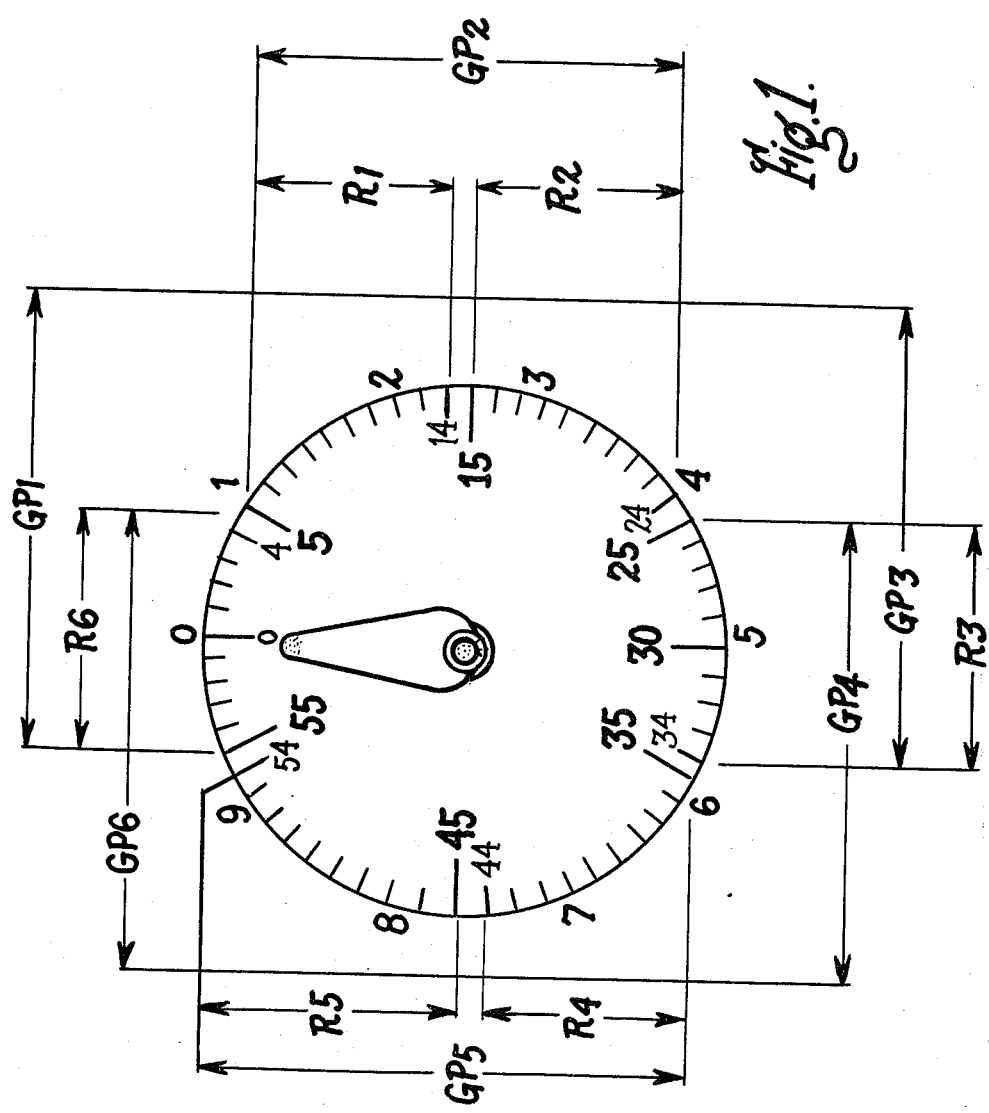
FIG. 1 is an illustration, useful in understanding the invention, showing how a gear disc of the aforementioned encoder resolves a meter gear or dial position into several groups and ranges for performing an inter dial check.

Prior to proceeding with a detailed description of the invention, it is first considered advantageous to describe basically how the aforementioned interdial check procedure is implemented by the present invention. As previously mentioned, the basis for the interdial check (IDC) is the definite and positive mechanical relationship that each gear in the encoder gear train has to adjacent gears. If the position of one gear or dial is known, other gears are restricted to certain positions relative to the known gear. In the aforementioned U.S. Pat. No. 3,846,789, and as shown in FIG. 1 of the present invention, an encoder gear disc resolves the gear or dial position of each dial to one part in 60. Because adjacent dials in a decade gear system have a 10:1 gear ratio, one would expect a dial N to move through one of six groups comprised of 10 of its 60 positions, while the next most significant dial N+1 moves through only 1 of its 60 positions. These 10 positions in a group of dial N would be an acceptable IDC group for a given position of dial N+1. However, due to tolerances in the encoder, and in order to increase the resolution of the encoder, the meter encoder widens each of the six groups to twenty positions instead of ten as shown by FIG. 1 and the following Table 1.

TABLE 1

| Position of N+1 | Acceptable Positions of N | Group Number of N |
|---|---|---|
| 0 | 55–14 | 1 |
| 1 | 5–24 | 2 |
| 2 | 15–34 | 3 |
| 3 | 25–44 | 4 |
| 4 | 35–54 | 5 |
| 5 | 45–4 | 6 |
| 6 | 55–14 | 1 |
| 7 | 5–24 | 2 |
| . | . | . |
| . | . | . |
| . | . | . |
| 59 | 45–4 | 6 |

In Table 1, N and N+1 are used to denote a particular dial and the next most significant dial respectively, which identify six groups GP1 through GP6 (see FIG. 1). It is significant to note, that there are six groups, but that they each contain twenty positions and therefore overlap. As shown in FIG. 1 and in the following Table 2, a given dial position of dial N falls in two groups and unique areas are desired in order to unequivocally state where N lies.

TABLE 2

| Positions of N | Groups of N |
|---|---|
| 5–14 | 1 & 2 |
| 15–24 | 2 & 3 |
| 25–34 | 3 & 4 |
| 35–44 | 4 & 5 |
| 45–54 | 5 & 6 |
| 55–4 | 6 & 1 |

In the logic of the encoder reader tester of the present invention, this overlap is handled by assigning a single 10 position range to each position of dial N, and then considering two of these ranges acceptable to a given position of dial N+1 when the reader tester is performing the interdial check. These range assignments are shown in the following Table 3 as well as in FIG. 1. Remember that two of these ranges constitute one group. The following Table 4 shows these ranges.

TABLE 3

| Positions of N | Range Number |
|---|---|
| 5–14 | 1 |
| 15–24 | 2 |
| 25–34 | 3 |
| 35–44 | 4 |
| 45–54 | 5 |
| 54–4 | 6 |

TABLE 4

| Group Number | Composed of Ranges |
|---|---|
| 1 | 6 & 1 |
| 2 | 1 & 2 |
| 3 | 2 & 3 |
| 4 | 3 & 4 |
| 5 | 4 & 5 |
| 6 | 5 & 6 |

When the reader tester of the present invention is performing an interdial check (IDC) the IDC is good if the position of dial N falls in the group of positions dictated by the position of dial N+1. So, if dial N is in either of the two ranges that constitute the acceptable group, the IDC is good.

As an example, suppose dial N is at position 4. The reader tester, from storage (via Table 3), determines that this position corresponds to Range 6 (R6 of FIG. 1). Also assume that dial N+1 is at position 0. From storage (via Tables 1 and 4), the reader tester determines that dial N must lie in Group 1 (GP1) which consists of ranges R1 and R6. Since it lies within GP1, the IDC passes. As a further example, if dial N+1 is at position 59, the tester determines that dial N must lie in Group 6 (GP6) which includes ranges R5 and R6. Since it does, the IDC passes. An example of an IDC failure is illustrated if it is assumed that dial N+1 is 1. The tester then determines that dial N must lie in Group 2 (GP2) which equals ranges R1 and R2. Since it does not, the IDC fails.

From a Boolean algebra viewpoint, the tester of the present invention is asking, when dial N+1 = 1 whether the statement (G2.R1)+(G2.R2) is true. The statement can be rewritten as G2(R1+R2) and this is a statement that the encoder tester would actually check if dial N+1 indicates that dial N should lie in GP2 for the IDC.

When the reader tester of the present invention is reading dial N, the tester sets a Group 1 (G1) compare latch if the dial position of N is in either of the ranges R6 or R1. In a similar manner, the tester sets a Group 2 (G2) compare latch if either R1 or R2 is the acceptable range, and so on as shown in the following Table 5.

TABLE 5

| Latch for Compare | Set by Ranges |
|---|---|
| $G_1$ | $R_6$ or $R_1$ |
| $G_2$ | $R_1$ or $R_2$ |
| $G_3$ | $R_2$ or $R_3$ |
| $G_4$ | $R_3$ or $R_4$ |
| $G_5$ | $R_4$ or $R_5$ |
| $G_6$ | $R_5$ or $R_6$ |

Then when the tester is processing dial N+1, it compares the group number it gets from dial N+1 to the group latch set by dial N. If they agree, the IDC passes. If they disagree, the IDC fails.

Figure 2:
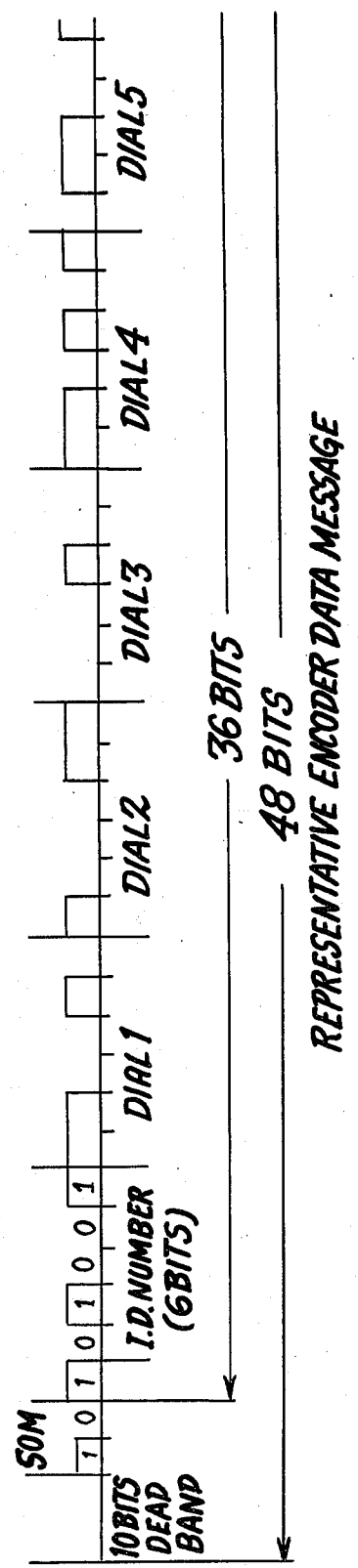
FIG. 2 illustrates the format of a representative message generated by the meter encoder.

With the preceding background, reference is now made to FIG. 2, which illustrates a representative encoder data message as provided to the meter tester of the present invention from the encoder meter. As shown, a message is made up of 48 bits with the first ten bits of the message comprising a "dead band" region followed by a 2 bit start of message (SOM) region. Following the end of the SOM region, the remainder of the message is made up of 36 bits comprised of 6 bits of an ID identification code number, utilized by the tester of the present invention to identify the particular meter transmitting its encoder data, followed by five 6 bit regions designated Dial 1 through Dial 5. The dial 1 through dial 5 regions carry binary coded information representative of the respective decimal dial readings of the meter.

The following Table 6 lists an identification "code" number for each of the various meter encoder identification codes capable of being recognized by the tester of the present invention. As can be seen in Table 6, 60 possible ID codes (0-59) can be transmitted to the tester from the respective encoders. (See U.S. Pat. No. 3,846,789.) As shown in a footnote of Table 6, there are four unused identification codes which are considered by the tester as invalid codes. The use of these codes will subsequently be described.

TABLE 6
IDENTIFICATION (ID) NUMBER DECODING TABLE

| ID # | Code (See Note) | ID # | CODE | ID # | CODE |
|---|---|---|---|---|---|
| 0 | 000000 | 20 | 111100 | 40 | 100010 |
| 1 | 000001 | 21 | 111101 | 41 | 100011 |
| 2 | 000101 | 22 | 111001 | 42 | 101011 |
| 3 | 000100 | 23 | 111000 | 43 | 101010 |
| 4 | 000110 | 24 | 111010 | 44 | 101000 |
| 5 | 000111 | 25 | 111011 | 45 | 101001 |
| 6 | 010111 | 26 | 110011 | 46 | 101101 |
| 7 | 010110 | 27 | 110010 | 47 | 101100 |
| 8 | 010100 | 28 | 110000 | 48 | 101110 |
| 9 | 010101 | 29 | 110001 | 49 | 101111 |
| 10 | 010001 | 30 | 110101 | 50 | 001111 |
| 11 | 010000 | 31 | 110100 | 51 | 001110 |
| 12 | 010010 | 32 | 110110 | 52 | 001100 |
| 13 | 010011 | 33 | 110111 | 53 | 001101 |
| 14 | 011011 | 34 | 100111 | 54 | 001001 |
| 15 | 011010 | 35 | 100110 | 55 | 001000 |
| 16 | 011000 | 36 | 100100 | 56 | 001010 |
| 17 | 011001 | 37 | 100101 | 57 | 001011 |
| 18 | 011101 | 38 | 100001 | 58 | 000011 |
| 19 | 011100 | 39 | 100000 | 59 | 000010 |

Notes: Codes 111111, 111110, 011110, and 011111 are detected by the tester as invalid.

Table 7 is a decimal dial decoding table which indicates the aforementioned 60 dial positions as previously described in connection with FIG. 1, as those dial positions correspond to their respective meter dial decimal readings and the corresponding binary codes transmitted as Dial 1 through Dial 5 readings in the message of FIG. 2. Also shown in Table 7, for correlation purposes to FIG. 1 and the aforementioned Tables 1-5, the acceptable next lower dial positions for dial N are shown for each position of dial N+1. See footnotes of Table 7.

TABLE 7
DECIMAL DIAL DECODING TABLE

| Dial Position | Decimal Reading | Code | Acceptable Next Lower Dial Positions | Dial Position | Decimal Reading | Code | Acceptable Next Lower Dial Positions |
|---|---|---|---|---|---|---|---|
| 0 | 9,0 | 000000 | 55-14 | 30 | 4,5 | 110101 | 55-14 |
| 1 | | 000001 | 5-24 | 31 | | 110100 | 5-24 |
| 2 | 0 | 000101 | 15-34 | 32 | 5 | 110110 | 15-34 |
| 3 | | 000100 | 25-44 | 33 | | 110111 | 25-44 |
| 4 | | 000110 | 35-54 | 34 | | 100111 | 35-54 |
| 5 | 0,1 | 000111 | 45- 4 | 35 | 5,6 | 100110 | 45- 4 |
| 6 | | 010111 | 55-14 | 36 | | 100100 | 55-14 |
| 7 | | 010110 | 5-24 | 37 | | 100101 | 5-24 |
| 8 | 1 | 010100 | 15-34 | 38 | 6 | 100001 | 15-34 |
| 9 | | 010101 | 25-44 | 39 | | 100000 | 25-44 |
| 10 | | 010001 | 35-54 | 40 | | 100010 | 35-54 |
| 11 | 1,2 | 010000 | 45- 4 | 41 | 6,7 | 100011 | 45- 4 |
| 12 | | 010010 | 55-14 | 42 | | 101011 | 55-14 |
| 13 | | 010011 | 5-24 | 43 | | 101010 | 5-24 |
| 14 | 2 | 011011 | 15-34 | 44 | 7 | 101000 | 15-34 |
| 15 | | 011010 | 25-44 | 45 | | 101001 | 25-44 |
| 16 | | 011000 | 35-54 | 46 | | 101101 | 35-54 |
| 17 | 2,3 | 011001 | 45- 4 | 47 | 7,8 | 101100 | 45- 4 |
| 18 | | 011101 | 55-14 | 48 | | 101110 | 55-14 |
| 19 | | 011100 | 5-24 | 49 | | 101111 | 5-24 |
| 20 | 3 | 111100 | 15-34 | 50 | 8 | 001111 | 15-34 |
| 21 | | 111101 | 25-44 | 51 | | 001110 | 25-44 |
| 22 | | 111001 | 35-54 | 52 | | 001100 | 35-54 |
| 23 | 3,4 | 111000 | 45- 4 | 53 | 8,9 | 001101 | 45- 4 |
| 24 | | 111010 | 55-14 | 54 | | 001001 | 55-14 |
| 25 | | 111011 | 5-24 | 55 | | 001000 | 5-24 |
| 26 | 4 | 110011 | 15-34 | 56 | 9 | 001010 | 15-34 |

TABLE 7-continued

DECIMAL DIAL DECODING TABLE

| Dial Position | Decimal Reading | Code | Acceptable Next Lower Dial Positions | Dial Position | Decimal Reading | Code | Acceptable Next Lower Dial Positions |
|---|---|---|---|---|---|---|---|
| 27 | | 110010 | 25–44 | 57 | | 001011 | 25–44 |
| 28 | | 110000 | 35–54 | 58 | | 000011 | 35–54 |
| 29 | 4,5 | 110001 | 45– 4 | 59 | 9,0 | 000010 | 45– 4 |

Note 1: Interdial checking (IDC) involves cross-checking the decoded Dial Position of one dial with the Dial Position of the next lower dial. If the next lower dial is not within the acceptable range, the decimal point between these two dials will flash indicating IDC failure.

Note 2: For the ambiguous conversion areas where two decimal values are shown for a given dial position use the larger value if the next lower dial is decimal 0–4 and the smaller value if the next lower dial is 5–9. For dial 1, always use the lower value.

BASIC OPERATIONAL DESCRIPTION

Figure 3:
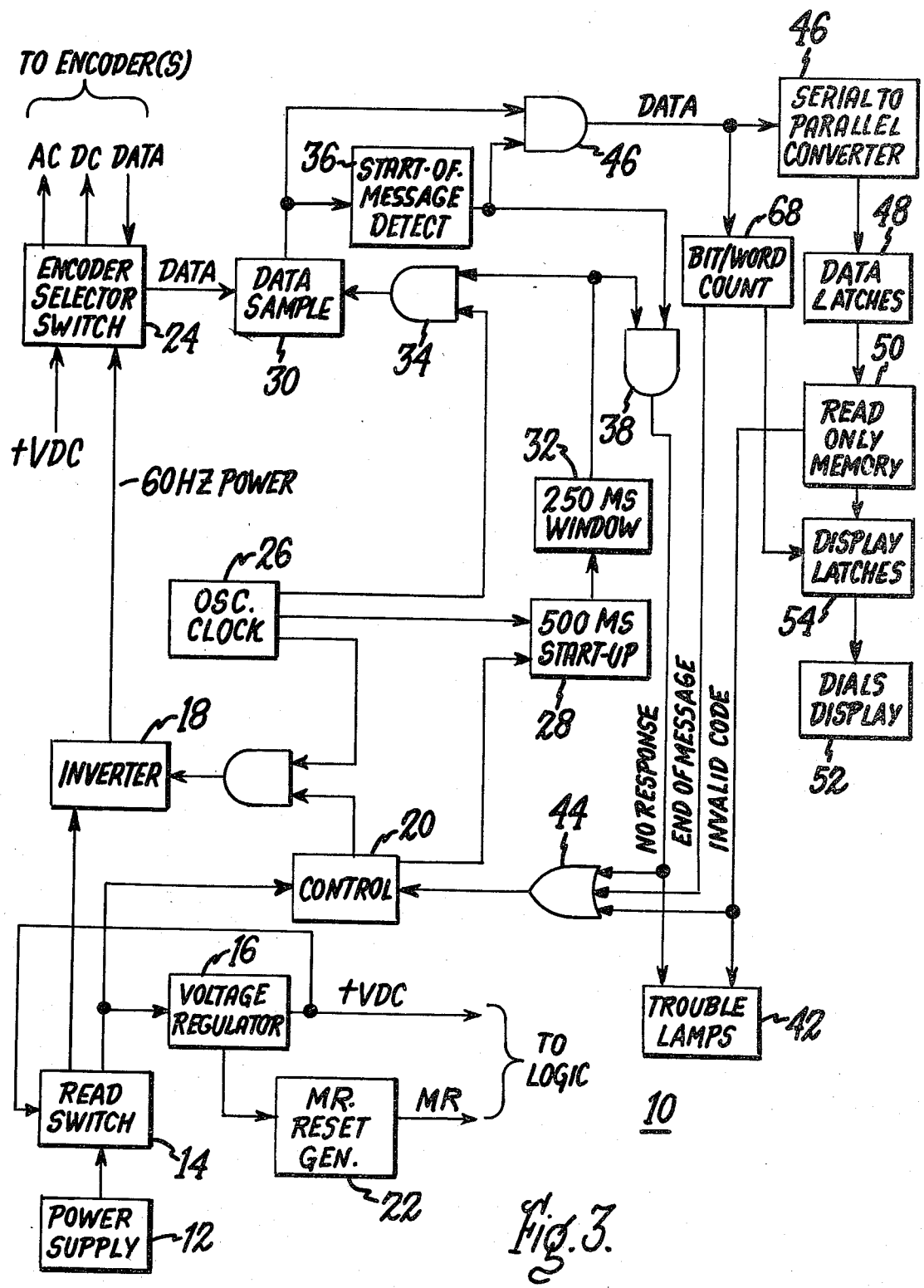
FIG. 3 is a functional block diagram and signal path flow chart of the encoder tester of the present invention useful in understanding the basic operation of the invention.

Reference is now made to FIG. 3, which is a functional flow chart useful in understanding the basic operation of the present invention. The encoder reader tester 10 of the present invention includes a power supply 12 which generates DC power to a Read Switch 14. Switch 14 is also shown on the front control panel of the reader tester of the present invention in FIG. 13. Read Switch 14 is a manually actuable switch which, when operated, allows DC power from the Power Supply 12 to be provided to a Voltage Regulator 16, a conventional DC to AC Inverter 18 and a Control Logic 20. When the read switch is operated, the power supply voltage applied to Voltage Regulator 16 causes that regulator to generate a +VDC DC voltage output which is provided to all of the logic within the reader tester. Additionally, the Voltage Regulator 16 generates a DC voltage signal which is applied to a Master Reset Generator 22 to effect the generation of a master reset (MR) pulse to reset the various shift registers, flip flops, latches, and counters in the logic circuitry of the reader tester.

Figure 13:
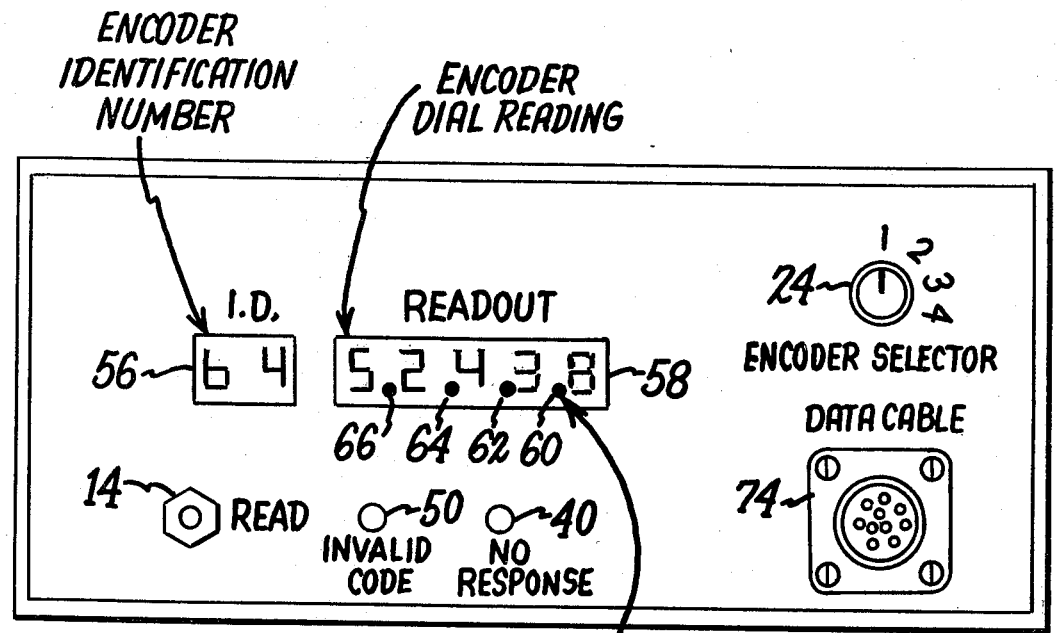
FIG. 13 is a front panel view of the encoder tester of the present invention.

The +VDC signal is also applied to an Encoder Selector Switch 24, also shown in FIG. 13. With operation of the Read Switch 14, the Inverter 18 is energized to supply 60 Hz AC power for the motor and lamp circuit of the meter encoder attached to the meter tester via the Encoder Selector Switch 24. Also, the +VDC power is supplied to the encoder via the Voltage Regulator 16. This +VDC power, as described in the aforementioned U.S. Pat. No. 3,846,789, is utilized to energize a relay which allows the 60 Hz AC power to be provided to the encoder drive motor and to the lamp utilized in the optical encoder mechanism.

Still referring to FIG. 3, an Oscillator Clock Generator 26 generates various clock signals which are utilized throughout the reader tester of the present invention to control timing operations. The Oscillator Clock Generator 26 begins to generate its respective output signals as soon as the Read Switch 14 is closed. One of its output signals goes to a 500 millisecond start-up or delay circuit 28 which is activated upon operation of the Read Switch via the Control Circuit 20. The purpose of the 500 millisecond Start-up is to allow sufficient time for the motor in the meter encoder to come up to full speed. Once the motor in the encoder has come up to speed, the data from the encoder is then passed through the Encoder Selector Switch 24 into a Data Sample circuit 30. After the 500 millisecond start-up delay, the 500 ms Start-up circuit 28 generates an output signal to a 250 ms Window circuit 32 causing that circuit to apply a 250 ms window pulse to one input of an And gate 34. The other input to Gate 34 is one of the clock signals from the Oscillator Clock 26. It is during this 250 ms window period that And gate 34 is enabled to allow the reader tester of the present invention to look for the start of message (SOM) sequence on the data line from the encoder via the Encoder Selector Switch 24. (See FIG. 2 for the SOM message start field.)

The start of message sequence consists of:
(1) Ten bits of high output (binary 1 bits). These constitute the inner message spacer called the "dead band" in FIG. 2,
(2) A single bit of high data (binary 1 bit) defining the first SOM bit and,
(3) A single bit of low data (binary 0 bit) defining the second SOM bit. These latter two bits define the start of message.

The data through Data Sample circuit 30 is provided to a Start of Message Detect circuit 36. This latter circuit generates a start of message output signal when the start of message bits are detected. However, if a start of message sequence is not found before the 250 ms window has closed to deactivate And gate 34, a No Response signal is generated via an And gate 38, also receiving the output from the Start of Message Detect circuit 36. The No Response signal from And gate 38 is applied to a No Response indicator lamp 40 as shown in FIG. 13, which exists in FIG. 3 in a trouble lamp circuit 42. The No Response signal is also applied to the Control Logic 20 via an Or gate 44 to cease further operations by the reader tester of the present invention.

If, during the SOM sequence, an SOM is found, the Start of Message Detect circuit 36 applies an enable signal to an And gate 46, also receiving the data message from the Data Sample circuit 30. Assuming that an SOM has been found, the reader proceeds to take in data via And gate 46 and breaking that data into 6 bit bytes as shown in FIG. 2 for decoding via a Serial to Parallel Converter 46. The first six bits after SOM (encoder data bits 13–18) are placed in Data Latches 48 where they are collected and used as address bits to a programmable Read Only Memory 50 to decode the encoder identification number (one of codes 0–59). See Table 6. If one of the ID codes being presented to the memory is an invalid code, the Read Only Memory generates an Invalid Code Output signal which is provided to the Control Logic 20 via Or gate 44 to terminate further read operations and also to an Invalid Code trouble lamp 50 of FIG. 13 encompassed within the Trouble Lamp circuit 42 of FIG. 3. When an acceptable or valid ID code is detected by the Read Only Memory, a decoded ID number is read from that memory and displayed on an ID Dial Display 52 via a Display Latch 54. The display for displaying the encoder identification number is shown in FIG. 13 by the numeral 56.

The second six bits of the message after SOM (data bits 19–24) are next collected and used as address bits, via Data Latches 48, to the Read Only Memory 50 to decode dial 1, the least significant dial reading as shown in FIG. 2. In this particular instance, the outputs from the Read Only Memory 50, via the Display Latches 54, are directed to the right most dial display on a Readout Digit Display 58 of FIG. 13, also included in the Dials Display 52 of FIG. 3. As previously described, if one of the four invalid codes is detected, the Invalid Code lamp will flash and the reading attempt will cease. Additionally, at this time, but not shown in FIG. 3, an output from the Read Only Memory 50 is stored for later use in performing the interdial check (IDC) after decoding the next dial (dial 2) input.

The third byte after SOM (data bits 25-30) are dial 2 data and are collected, decoded and displayed as previously described with the addition of using other inputs from the Read Only Memory to check against the data saved from dial 1 for the IDC. If the IDC fails, a Decimal Point Light 60 between the displays for dials 1 and 2 in FIG. 13 will flash but the reader will continue with the dial reading process. Again, detection of any one of the four invalid codes results in a flashing Invalid Code lamp 50 and termination of the reading process. Also, as previously described, the output from the Read Only Memory is stored for later use in the IDC test.

The next six data bits from the encoder (data bits 31-36) are dial 3 data and are treated in the manner as just described for the dial 2 data bits. In this instance, an IDC failure will flash a Decimal Point Lamp 62 between the displays for dials 2 and 3 as shown in FIG. 13.

The fifth byte of 6 data bits, after the SOM sequence (data bits 37-42) are dial 4 data and are collected and treated as described above with an IDC failure yielding a flashing Decimal Point Lamp 64 between the displays of dials 3 and 4, as shown in FIG. 13.

The last 6 bits of the encoder message (data bits 43-48) are dial 5 data and are collected, decoded, compared and displayed as described above with an IDC failure giving a flashing decimal point between the fifth (left most significant digit) dial position and dial number 4 displays. In FIG. 3, a Bit/Word Count 68 is utilized to count the words and bits of the input data message to generate an End of Message output signal via Or gate 44 to the Control Logic 20 after the entire 48 bit message has been received, thus terminating the operation of the meter tester. The Bit/Word Count 68 also provides input signals to the Display Latches 54. These input signals are utilized to direct the outputs from the Display Latches to the proper dial displays (1-5) in the Dial Display 52 during the reading process.

DETAILED OPERATIONAL DESCRIPTION

Figure 10:
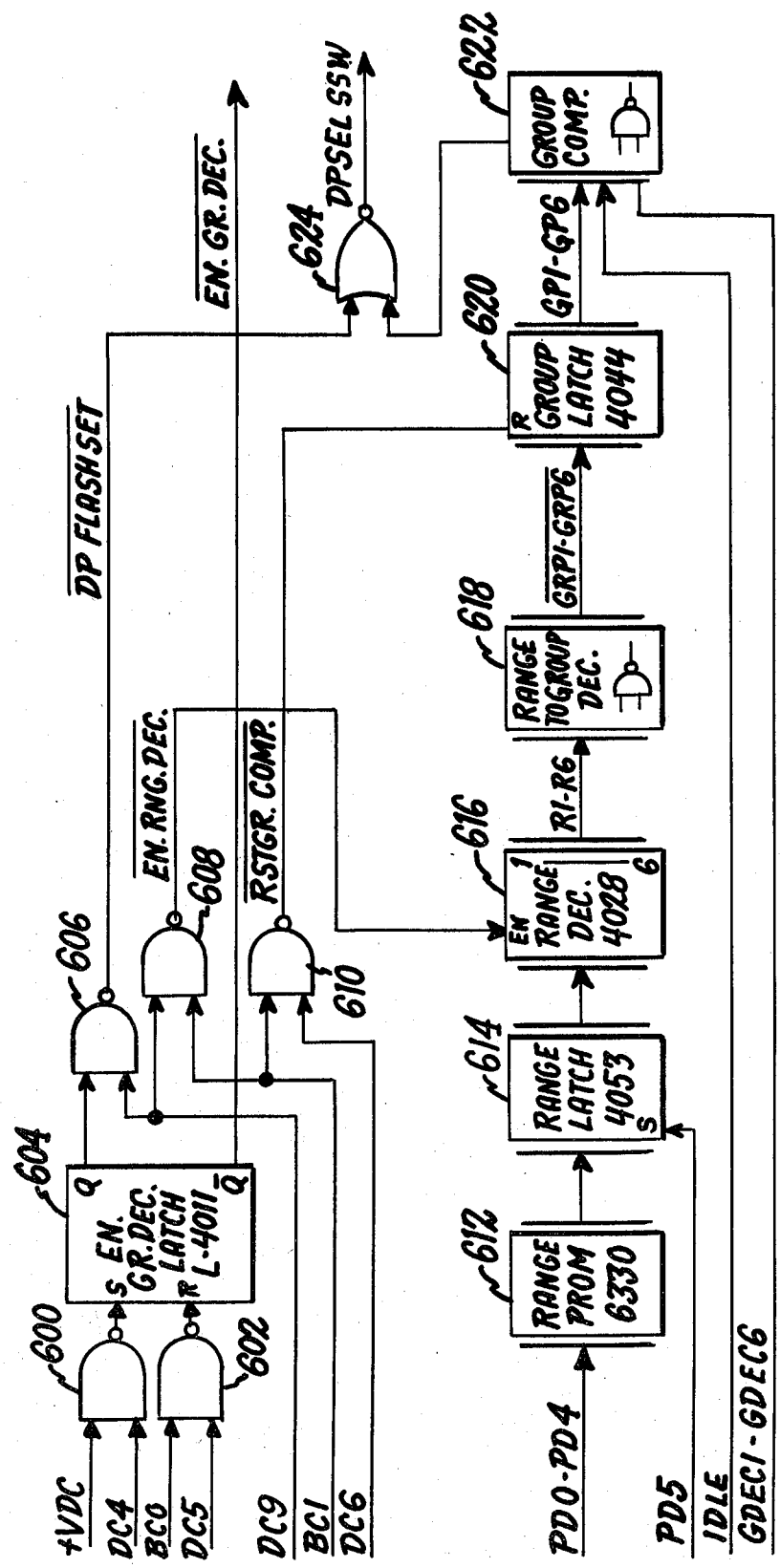
Figure 11:
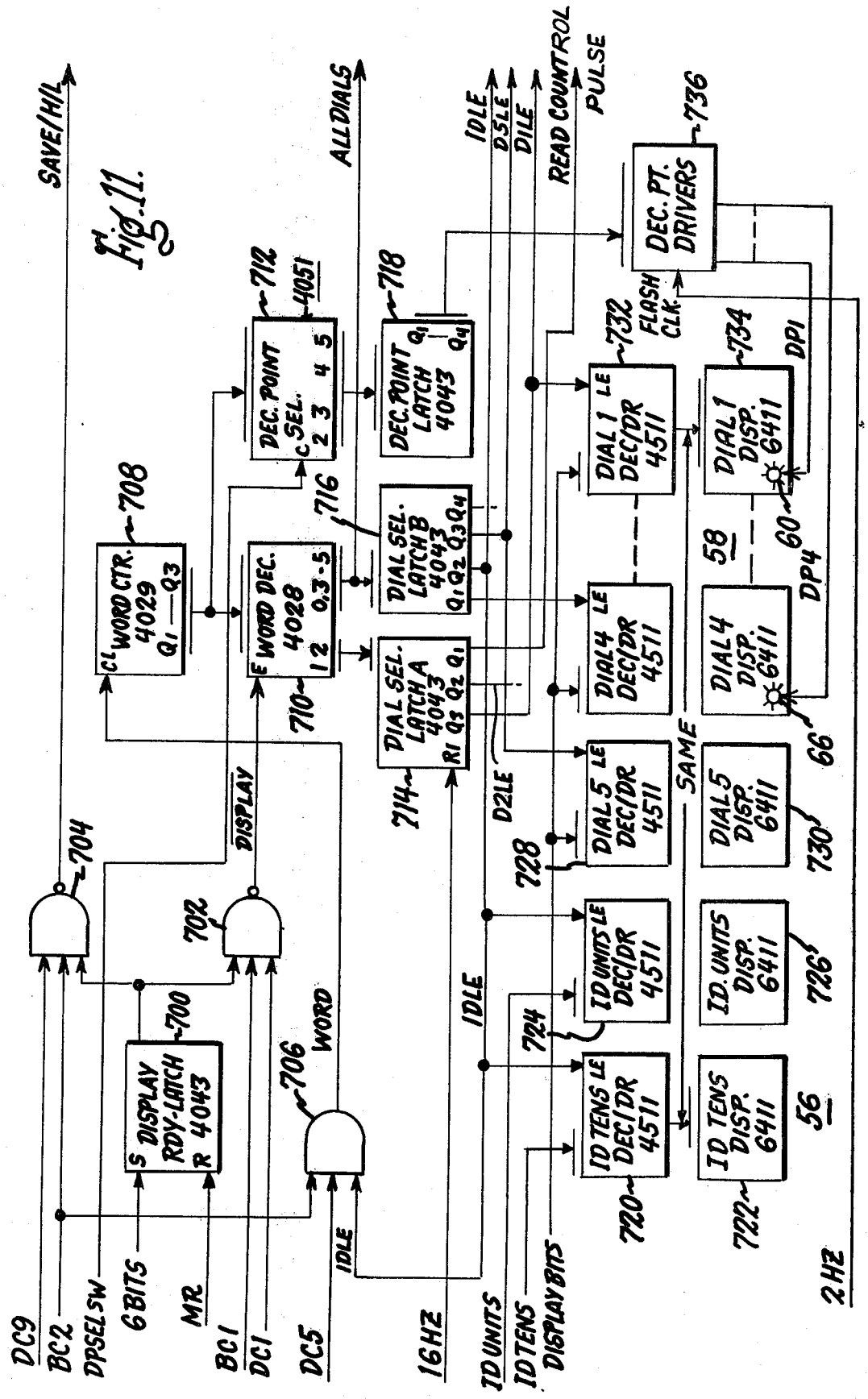
Figure 12:
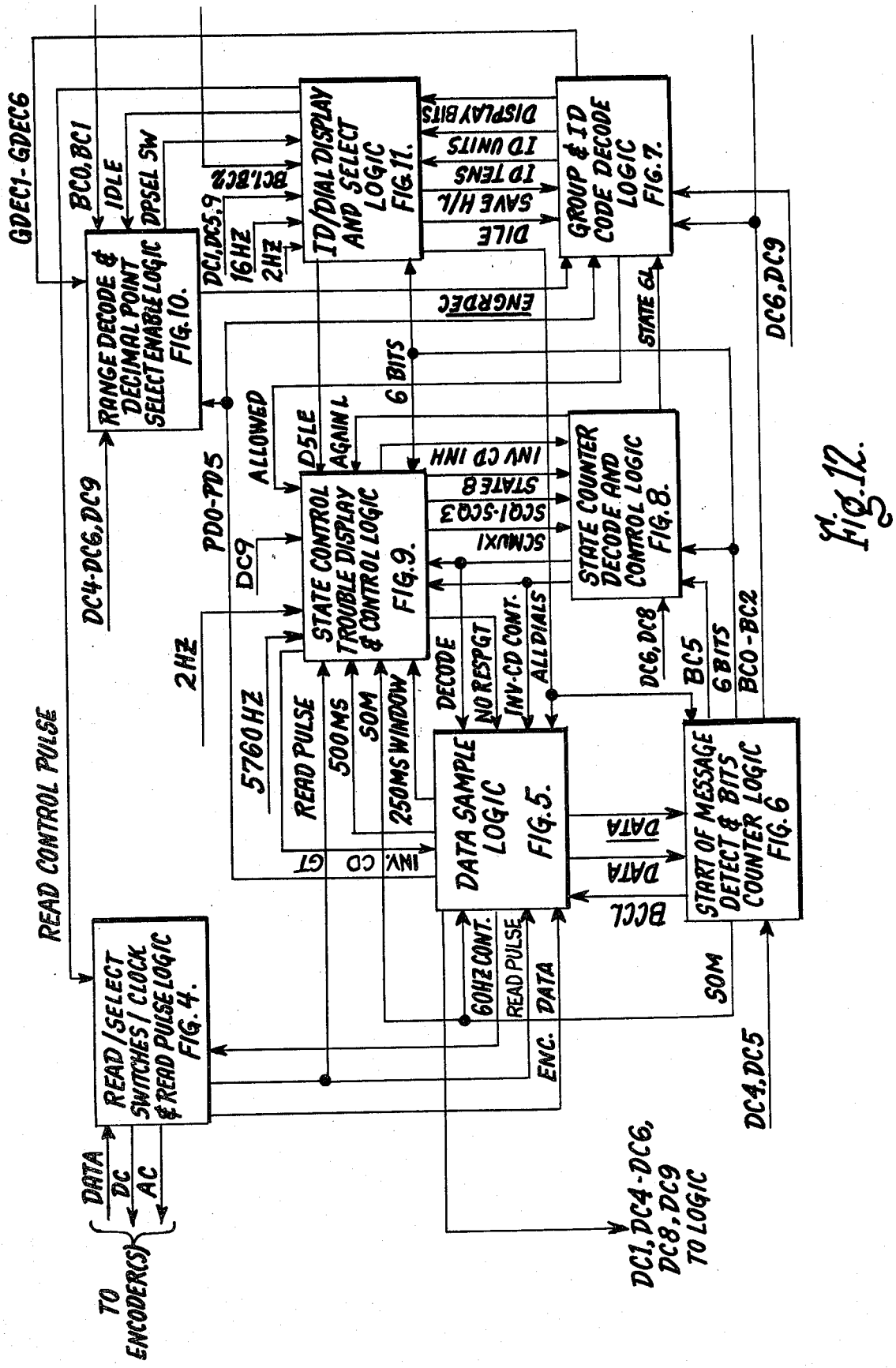
FIG. 12 is a major block diagram, useful in understanding the operation of the invention, illustrating each of the circuits of FIGS. 4–11 connected together to show the signal paths between the various circuits.

With a basic understanding of the operation of the reader tester of the present invention, reference is now made to FIG. 12 in combination with FIGS. 4 through 11. As shown in FIG. 12, each of the major blocks in that figure encompasses one of the FIGS. 4 through 11 and illustrates the signal flow paths between the various circuits within the reader tester of the present invention. In the ensuing detailed operational description of the invention, reference should be frequently made to FIG. 12, since that figure shows the interconnections between the various circuits of the system which will be described. It should also be noted in FIGS. 5 through 11 that the major blocks in those figures each contains a number which identifies those circuits by their type. The present invention is preferably constructed from integrated circuits of which the type numbers in the blocks of FIGS. 5 through 11 can be found in the RCA COS/MOS Integrated Circuits Catalog published in July 1977 and copyrighted that same year.

Figure 4:
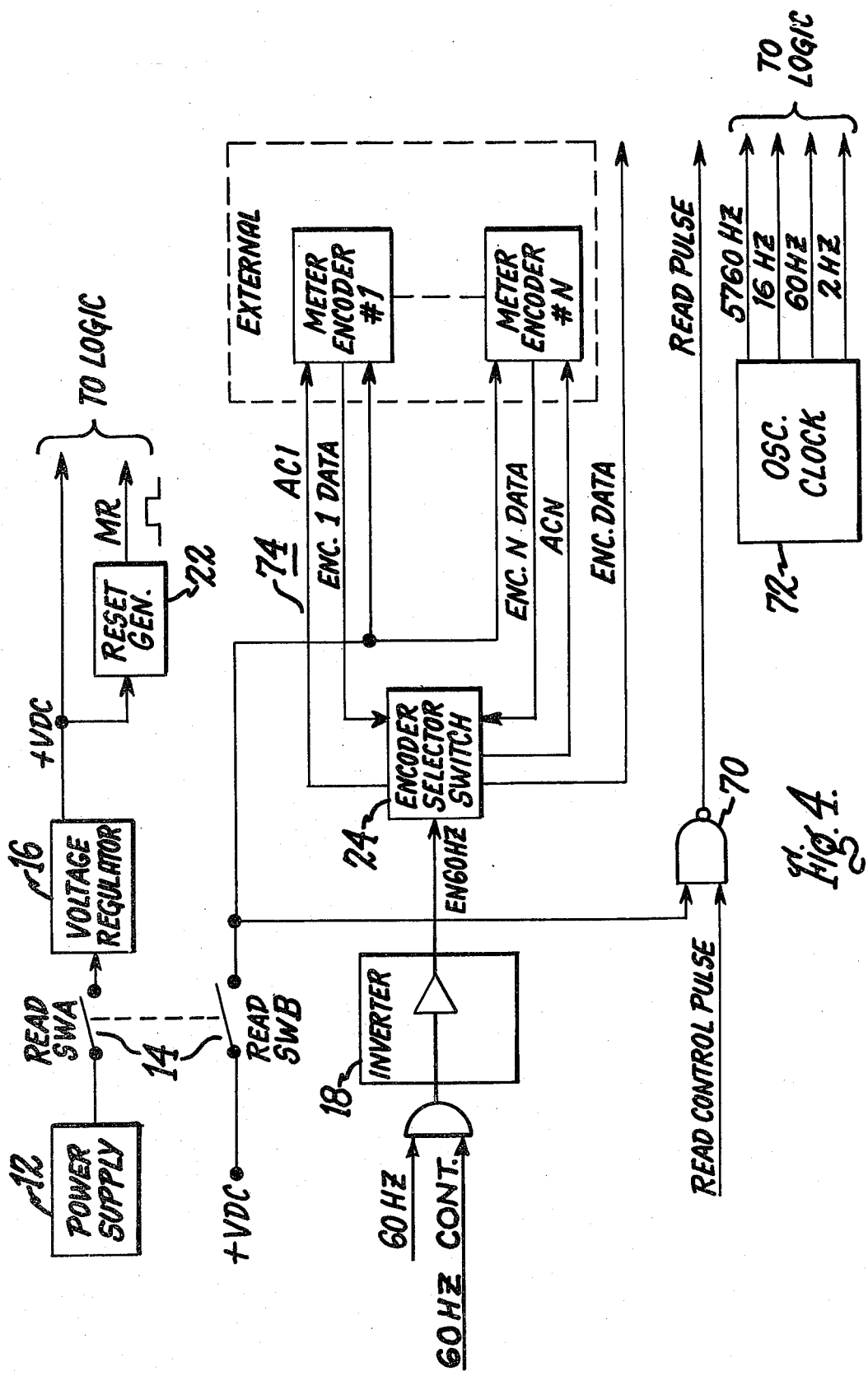
FIGS. 4–11 are individual detailed logic circuit schematics of the various functional circuits of the encoder tester comprising the present invention.

Reference is first made to FIG. 4, which includes the Encoder Select Switch 24, an Oscillator Clock 72 and read pulse generator logic for the reader tester. To read a specific meter encoder, out of a plurality of encoders designated Meter Encoder #1 through Meter Encoder #2 at a designated remote location external to the tester, the Encoder Selector Switch 24 (FIGS. 4 and 13) is placed to one of positions 1 through 4 to select the meter encoder to be tested. With the particular meter encoder selected, an operator of the reader tester merely activates the Read Switch 14, closing its contents SWA and SWB. Closure of the SWA contact immediately applies the power supply voltage to the Voltage Regulator 16 which generates the +VDC output voltage to all of the logic in FIGS. 4 through 11 and also causes the Reset Generator 22 to generate a manual reset pulse MR for application to the various latches, flip flops, counters and shift registers in the logic to initialize the reader tester for reading the encoder data.

Still referring to FIG. 4, upon the closure of contact SWB, the +VDC signal is simultaneously applied to each of the meter encoders 1 through N to enable a relay in each of those encoders for application of AC power to each ones drive motor. Immediately upon closing contact SWB, the +VDC signal is also applied to a Nand Gate 70 of FIG. 4, immediately causing its output to generate a binary 1 Read Pulse which is applied to the set(s) input to a 60 Hz Control Latch 102 in FIG. 5. Referring to FIG. 11, to a Dial Select Latch 714, it will be noted that a Read Control Pulse is generated from the Q1 output stage of that Latch and applied as a second input to Nand Gate 70 of FIG. 4. The MR pulse which is generated by Reset Generator 22 causes the Dial Select Latch 714 to be reset, thus at this point the Read Control Pulse is a binary 0 causing the Nand Gate 70 to be disabled to generate a positive or binary 1 Read Pulse to set the 60 Hz Control Latch 102.

It will be noted in FIG. 11 that a 16 Hz pulse from the Oscillator Clock 72 is applied to a reset R1 input terminal of Latch 714. Upon the occurrence of the first 16 Hz pulse, after the generation of the MR pulse, the 16 Hz pulse sets the Q1 stage of the Select Latch 714, causing the Read Control Pulse to go to a binary 1, thus enabling Nand Gate 70 and causing the Read Pulse to go negative to a binary 0 and removing the set pulse from the Control Latch 102 of FIG. 5.

Figure 5:
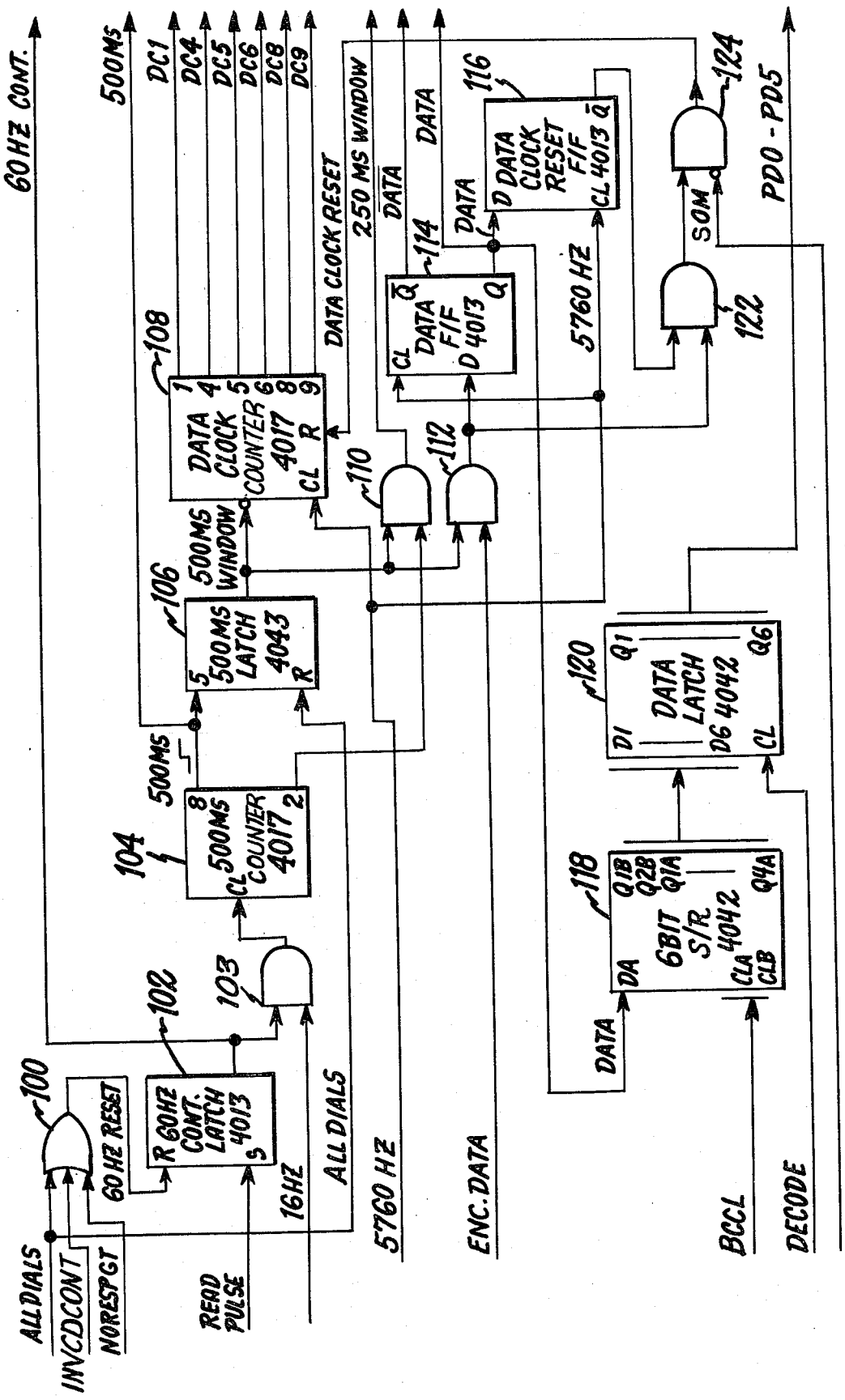

Referring to FIGS. 4 and 5, it will be noted that when the Control Latch 102 is set, its output generates a 60 Hz Control signal which is applied as one input to an And Gate in the Inverter 18 of FIG. 4. The 60 Hz signals from the Oscillator Clock 72 of FIG. 4 are also applied to the And Gate to now enable Inverter 18 to provide an EN 60 Hz (Encoder 60 Hz) signal to the selected meter encoder via the Encoder Selector Switch 24. The EN 60 Hz signal is supplied, via Encoder Selector Switch 24, to the selected encoder as one of the signals designated AC1 through ACN. Assuming that the Encoder Selector Switch 24 is set to select Meter Encoder 1, that meter encoder's motor will receive the AC1 power and start the encoder to transmit data (ENC 1 DATA) through the Encoder Selector Switch 24 into Data Sample Logic of FIG. 5 as one input to an And Gate 112.

Referring now to FIG. 5, to an AND Gate 103, the output of the Control Latch 102 is applied to that gate in conjunction with the 16 Hz pulses from the Oscillator Clock 72 in FIG. 4 to enable that gate to apply 16 Hz clock pulses to a 500 ms Counter 104. The Counter 104 counts 8 of the 16 Hz clocks to generate a 500 ms output pulse to set a 500 ms Latch 106 and also to provide the 500 ms pulse to a 1 input terminal of a State Counter Multiplexer SCMUX1 502 in FIG. 9. Referring now back to FIG. 5, the 500 ms Latch 106 is now set to provide a 500 ms Window pulse as one input to each of two And Gates, 110 and 112. And Gate 112 is now enabled to allow the encoder data (ENC-DATA) from the Encoder Selector Switch 24 of FIG. 4 to be entered into a Data Flip Flop 114 of FIG. 5. The data entering Flip Flop 114 of FIG. 5 is sampled at a 5760 Hz rate from pulses from the Oscillator Clock 72 (which is 10 times the data rate) by application of the 5760 Hz clock to a CL input terminal of the Data Flip Flop 114. The 5760 Hz clock is also applied to a CL input of a Data Clock Counter 108 and to the CL input of a Data Clock Reset Flip Flop 116 of FIG. 5.

Counter 104 will roll over to zero and continue counting 16 Hz pulses. At a count of 2, the 2 output from Counter 104 will go to a binary 1 to enable And Gate 110. After two more 16 Hz clocks, the 2 output of the counter goes to a binary 0, thus disabling gate 110 and closing the 250 ms window. If a complete encoder message is not received before the 250 ms window is closed, a No Response GT signal is generated at the output of an And Gate 512 of FIG. 9. This signal is applied to an Or Gate 100 of FIG. 5 to reset the 60 Hz Control Latch 102 to prevent further encoder reading.

Reference is now made back to FIG. 5 to a Data Clock Counter 108 which receives the 500 ms window pulse at an inhibit input having an inverter thereon. The Data Clock Counter 108 is inhibited from counting so long as the 500 ms window pulse is at a binary 0. However, as soon as that pulse goes to a binary 1, the Data Clock Counter is enabled to count the 5760 Hz clock pulses applied to a CL input terminal. It should be noted however, that the Data Clock Counter receives a Data Clock Reset input pulse at an R input terminal via two And Gates 122 and 124. And Gate 122 receives the encoder data from the output of And Gate 112 and also receives complemented encoder data, delayed one bit, from the Data Clock Reset Flip Flop 116 from its Q output terminal. Thus it can be seen that the sampled encoder data is delayed and complemented by Data Clock Reset Flip Flop 116 and handed with the positive pulse transitions of the data from And Gate 112. The output of And Gate 122 is anded in And Gate 124, also having an inhibit input, with the start of message signal (SOM). Until a start of message is detected, the SOM signal is a binary 0, thus keeping And Gate 124 enabled to pass data 1 bits as the Data Clock Reset signal to keep the Data Clock Counter reset until the Dead Band is found (10 binary 0's) and a start of message is detected.

The Data Clock Counter 108 is basically a Johnson decade counter that divides the 5760 Hz input pulses by 10 and uses its fifth output (DC4) to determine the center of the encoder data bits. Other outputs from Data Clock Counter 108 are DC1, DC5, DC6, DC8 and DC9, with outputs DC2, DC3 and DC7 not being used in the system. The pulses generated by the Data Clock Counter 108 are sequential in nature with DC1 being generated first, then DC4, 5, 6, 8 and 9.

Figure 6:
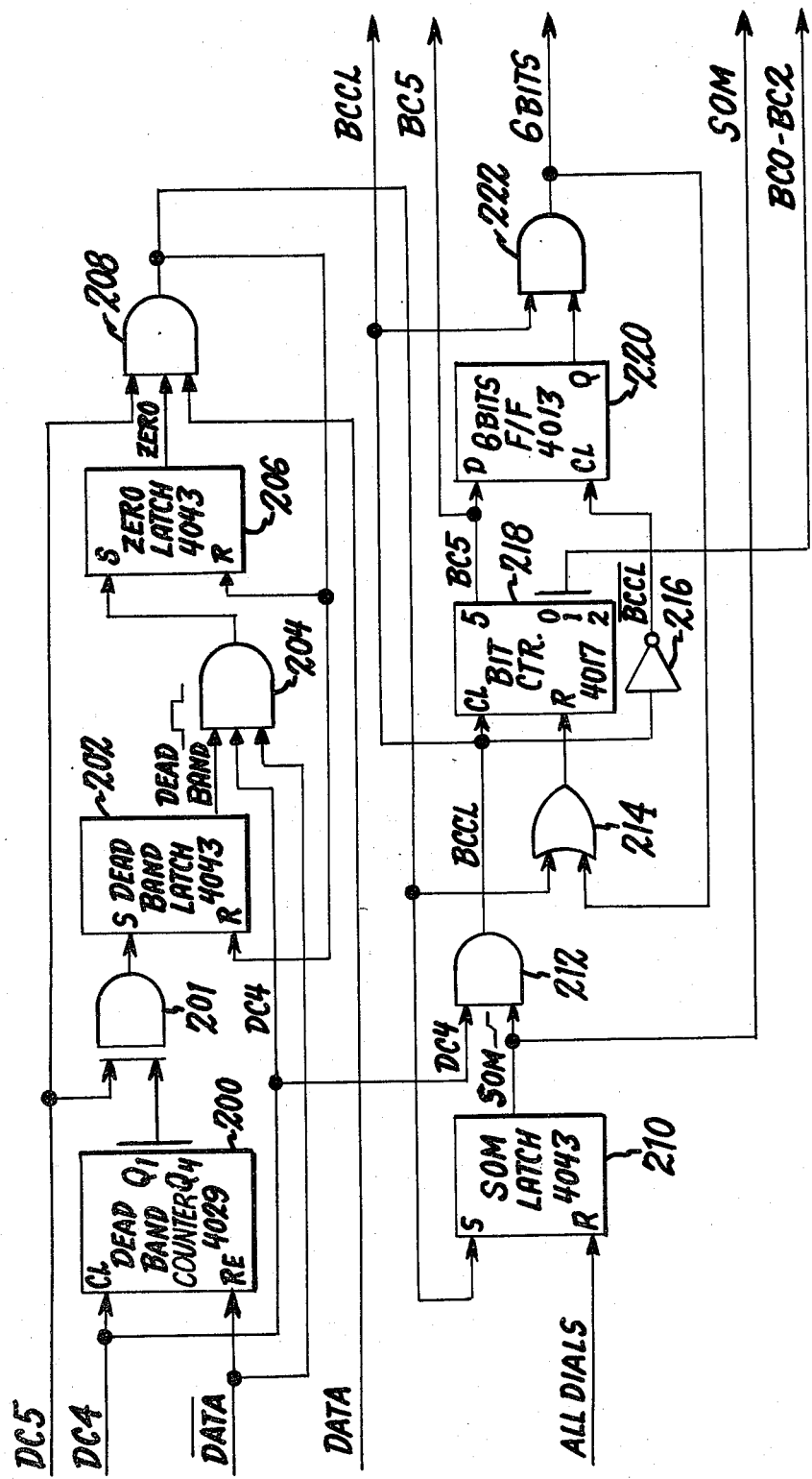

Referring now to FIGS. 5 and 6, the Data output signals from the Data Flip Flop 114 are applied to a reset enable (RE) input terminal of a Dead Band Counter 200 of FIG. 6. The DC4 center bit pulses are applied to a clock (CL) input of that flip flop. Counter 200 is designed such that binary 1 data signals applied to the counter cause it to count 1's and binary 0 data signals will reset the counter. When nine consecutive 1's have been counted, as detected by an And Gate 201 receiving outputs Q1 through Q4 from Counter 200, a Dead Band Latch 202 is set at DC5 time to generate a Dead Band signal which is applied as one input to an And Gate 204. The generation of the Dead Band pulse indicates that the Dead Band has been found and the next 0 in the data applied to And Gate 204 in conjunction with the DC4 center pulse enables Gate 206 to set a Zero Latch 204 to generate a Zero detect pulse to an And Gate 208. Finally, in this chain of events, the next 1 bit in the Data from the Data Flip Flop 114 of FIG. 5 will cause And Gate 208 to be enabled at DC5 time to indicate the detection of the second start bit which will set an SOM Latch 210 of FIG. 6, yielding the generation of the SOM (start of message) pulse. It can now be seen how the SOM pulse is applied from FIG. 6 to Gate 124 of FIG. 5 to now inhibit further resetting of the Data Clock 108. It will be noted in FIG. 6, that the output of Gate 208 detecting the start of message generates a binary 1 signal which resets the Zero and Dead Band Latches 206 and 202 respectively to thus inhibit further operation of those circuits. It will further be noted that the output from the AND Gate 208 also resets a Bit Counter 218 via an OR Gate 214. Also, at this time, since the output of AND Gate 208 set the SOM Latch 210, that latch is enabled to generate the SOM signal to enable an AND Gate 212 to begin passing DC4 pulses to generate a bit counter clock pulse (BCCL) to drive the Bit Counter 218.

The Bit Counter 218 counts the data pulses via the center data pulses DC4, to generate a Bit Counter (BC5) output for each 6 data encoder bits to set a 6 Bits Flip Flop 220 which is clocked by the complement (BCCL) of the BCCL signal via an Inverter 216. The output of the 6 Bits Flip Flop 220 is provided to an AND Gate 222 in conjunction with the BCCL signal from AND Gate 212 to generate a 6 Bits signal indicating the receipt of each 6 bit byte of data received from the encoder. It should also be noted that the 6 Bits is fed back to reset the Bit Counter via OR gate 214. The Bit Counter 218 also provides Bit Count output signals BC0 through BC2 which are utilized in the Group and ID Code Decode logic of FIG. 7 and in the Range Decode and Decimal Point Select Enable Logic of FIG. 10 as will subsequently be described. Additionally, the 6 bits output signal from Gate 222 is utilized in the State Counter Decoding Control Logic of FIG. 8 and in FIGS. 9 and 11 of the State Counter Trouble Display and ID dial Display Select Logic.

Reference is now made to FIGS. 5 and 6, wherein the BCCL signal from Gate 212 is applied to the clock input terminals CLA and CLB of a 6 Bit Shift Register 118. The Shift Register 118 converts the serial received data from the Data Flip Flop 114 into parallel data for placement into a Data Latch 120 in 6 bit bytes (i.e. each byte of ID code and dial information from the encoder). Each 6 bit byte of data is loaded into the Data Latch 120 by a Decode signal applied to a CL input terminal of Latch 120 from the output of DEC.2 Latch 408 of FIG. 8.

Figure 8:
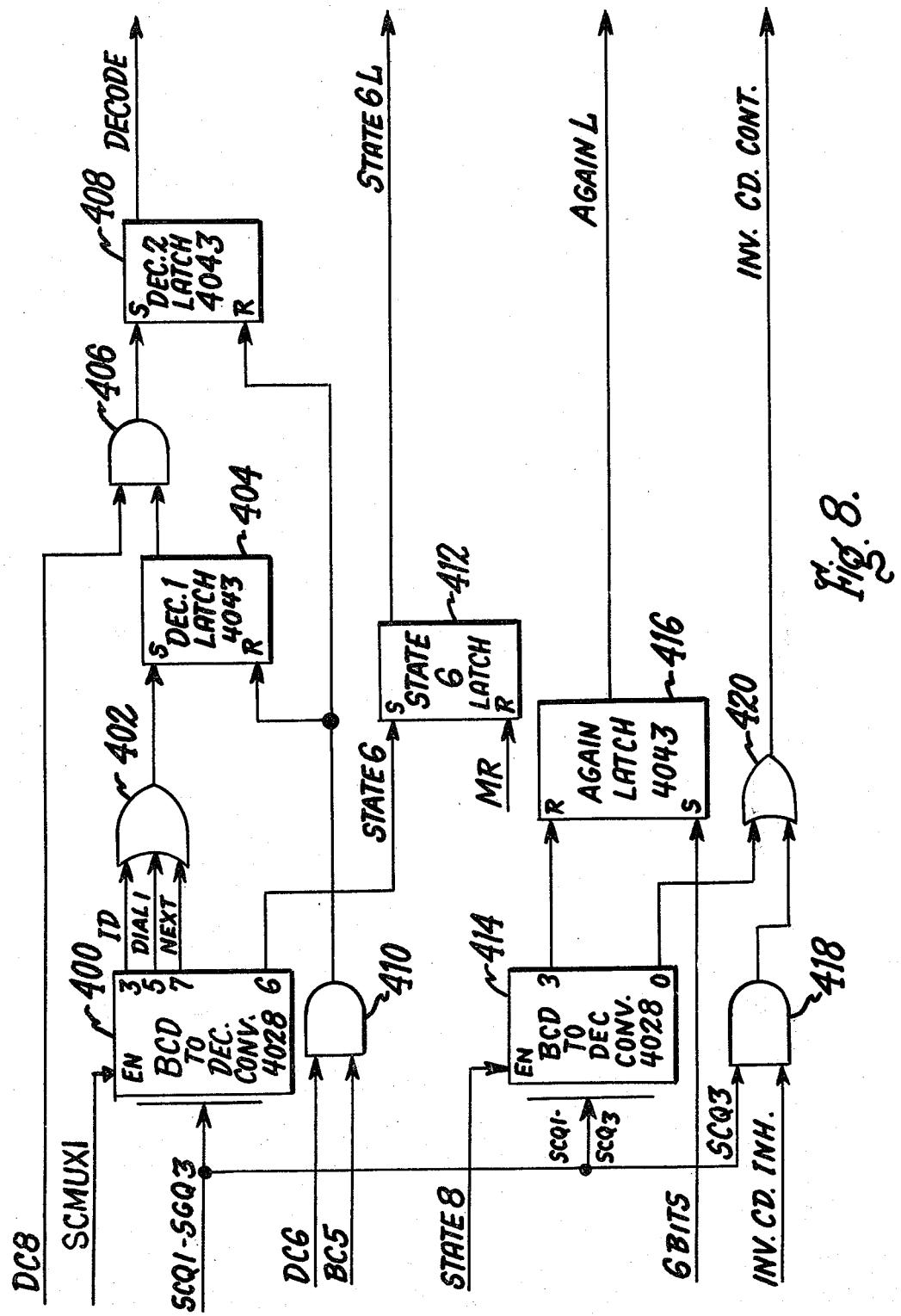
Figure 9:
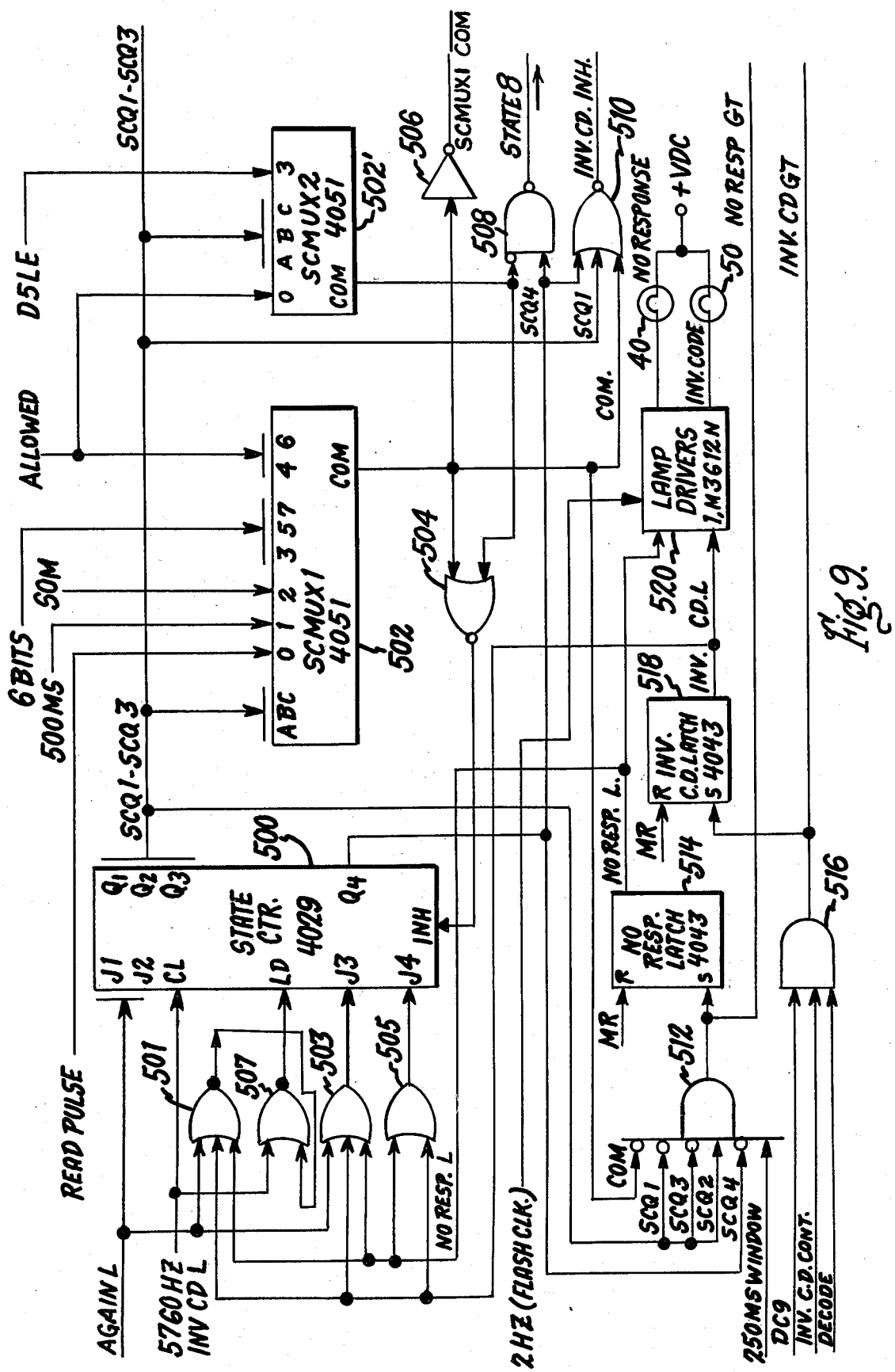

To further understand the operation of the invention, it is now considered advantageous to describe how the Decode signal and other signals of FIG. 8 are generated by reference first to FIG. 9 to a State Counter 500 and to two multiplexers SCMUX1 502 and SCMUX2 502'. The state Counter 500 is a 4 bit binary counter receiving the 5760 Hz. clock signals at a CL input terminal which cause the counter to count in a straight-forward binary fashion. Additionally, Counter 500 has 4 jam input terminals J1 through J4. The jam input signals to the counter are provided via two NOR Gates 501 and 507 and two OR Gates 503 and 505. The signal inputs to these various gates are generated at various times in the operation of the tester in a manner to subsequently be described. However, for the present, suffice to say that these signals are utilized to set the counter to prescribed counts on the parallel transfer of certain information into inputs J1 through J4.

Counter 500 also includes an inhibit input terminal (INH), which receives a signal from the output of a NOR Gate 504. When the input signal to the INH terminal of the counter is a binary 1, the counter is inhibited from counting. Also, the counter provides three output signals SCQ1 through SCQ3 representative of various count states of the counter to inputs A, B and C of the two multiplexers 502 and 502'. Additionally, an output SCQ4 from the Q4 output terminal of Counter 500 is generated and representative of State 8 of the counter and is provided as one input to a NAND Gate 508 and to the input of an AND Gate 512.

Each of the Multiplexers 502 operate to decode at their respective A, B and C inputs the SCQ1 and SCQ3 state output signals from the Counter 500 to enable their respective output terminals COM to pass the binary state of the selected input signals coming into terminals 0 through 7 of Multiplexer 502 and terminals 3 and 0 of Multiplexer 502'. It will be noted that the COM output of Multiplexer 502 is provided as one input to the NOR Gate 504. The COM output from Multiplexer 502' is also connected as a second input to NOR Gate 504. When both of the inputs to Gate 504 are binary 0's, its output is a binary 1, to thus inhibit the counting operation of Counter 500. However, when either one of the inputs to Gate 504 goes to a binary 1 state, that gate's output goes to a binary 0, to thus remove the inhibit to Counter 500 allowing it to count the 5760 Hz. input clock signals.

To understand how the State Counter operates, first assume that the Read Switch 14 has just been activated, placing the state Counter 500 in the reset state. As previously described, the first signal generated in the tester, subsequent to the activation of the read switch, is the Read Pulse signal, which is applied to the 0 state input of Multiplexer 502. Recalling at this time that Counter 500 is reset, the SCQ1 through SCQ3 signals are decoded in Multiplexer 502 to allow the binary 1 Read Pulse to be transferred through the multiplexer to the input of Gate 504. This binary 1 signal now causes the output of Gate 504 to go to a binary 0, removing the inhibit from Counter 500 and allowing it to now count one 5760 Hz. clock pulse. As soon as the counter achieves the count of State 1, the SCQ1 through SCQ3 output signals are now decoded in the multiplexer to enable the 500 ms input signal from the 500 ms Counter 104 of FIG. 5 to be passed through the multiplexer to NOR Gate 504. As soon as the 500 ms pulse goes to a binary 1 state, NOR Gate 504 removes the inhibit, thus allowing the counter to advance to State 2.

With the counter now in State 2, the aforementioned SOM pulse is routed through the multiplexer to inhibit the Counter 500 so long as the SOM signal is a binary 0. As soon as the SOM signal from the SOM Latch 210 of FIG. 6 goes to a binary 1, the counter is allowed to again count by removal of the inhibit signal through Gate 504 and thus advance the Counter 500 to State 3. In State 3, the 6 Bits signal line from Gate 222 of FIG. 6 remains at a binary 0 state until 6 bits of the message from the encoder have been detected, inhibiting Counter 500 and locking it in State 3. As soon as the first 6 bits, or any other 6 bits of the message are detected, the 6 Bits signal goes to a binary 1, removing the inhibit from Counter 500 as just described, allowing the counter to now step to State 4. The counter will now remain in State 4 until an Allowed signal from a NAND Gate 313 of FIG. 7 becomes a binary 1. Thus it can be seen, so long as the Allowed signal is a binary 0, the State Counter 500 is inhibited from counting and will remain in State 4. As soon as the Allowed signal goes to a binary 1, the counter will now be allowed to count to State 5.

At this point, it should be noted that the Multiplexer 502 also receives the 6 bits signal at its State 5 input terminal. Thus, so long as the 6 bits signal is a binary 0 the counter will remain in State 5. When the next 6 bits of the encoder message are received, the counter is enabled to then step to state 6. The Allowed signal is now again controlling the next state of the counter. When the Allowed signal again goes to a binary 1, the counter steps to State 7 and stops, waiting for the next binary 1 6 Bits signal to enable the counter to step from State 7 into State 8. The counter will remain in State 8 until the Allowed signal at the 0 or State 8 input terminal of Multiplexer 502' achieves a binary 1 state. Also, it should be noted that the Q4 output generating signal SCQ4 from Counter 500 goes to a binary 1 when the counter steps into State 8. Also at this same time, the SCQ1 through SCQ3 signals all go to binary 0's to thus select the Allowed input via the State 8 (0) input terminal of Multiplexer 502'. When the Allowed signal again goes to a binary 1, the inhibit is thus removed from the State Counter 500, allowing the counter to now count through States 9 and 10 which are not used in the present invention, and proceed into State 11.

State 11 of the counter is now being decoded by inputs A, B and C of Multiplexer 502' to route a D5LE signal through its 3 (State 11) input terminal to the input of Gate 504. As previously described, so long as the D5LE signal is a binary 0, the counter will remain in State 11. The D5LE signal remains in a binary 0 state until the last dial (Dial 5) reading has been processed by the tester.

Assuming that the last dial reading has not been processed, a signal, Again L, is applied to the J1 and J2 input terminals of Counter 500, as well as to the J3 input terminal via OR Gate 503. NOR Gate 501 also receives the Again L signal along with two other signals Invalid Code Latch, and No Response Latch. These three input signals to Gate 501 are normally binary 0's, thus causing the output of Gate 501 to be a binary 1. The binary 1 output from Gate 501 normally keeps NOR Gate 507 disabled to prevent the 5760 Hz. pulses from being applied to the LD input of Counter 500. However, at this time since the Again L signal is a binary 1, the output of Gate 501 is a binary 0 enabling Gate 507 to pass the 5760 Hz. clock signal to jam the Again L signal into input terminals J1, 2 and 3. As can be seen, the counter now has been forced to return back to State 7. Thus the outputs SCQ1 through SCQ3 cause the multiplexer 502 to select the State 7 input from the 6 Bits line. The counter will now proceed as previously described stepping to State 8 and then proceeding to State 11 where the Multiplexer 502' continues to look for a binary 1 state of the D5LE signal. Assuming that the D5LE signal is still a binary 0, the jamming operation just described will again take place by jamming the binary 1 Again L signal into Counter 500. This operation will continue until the D5LE signal goes to a binary 1.

When the Multiplexer 502' detects a binary 1 D5LE, its COM output terminal will thus cause NOR Gate 504 to remove the inhibit from Counter 500. This allows the state counter to now step to State 12, causing the COM output terminal of Multiplexer 502' to go to a binary 0, inhibiting the counter and causing it to hang up in State 12 until it is again reset by the manual reset switch. When the binary 1 state of the D5LE signal is detected by Multiplexer 502', an entire encoder message has been processed by the tester of the present invention.

Reference is now made to FIG. 8, wherein the generation of the aforementioned Decode signal can now be understood. As shown in that figure, the state output signals SCQ1 through SCQ3 from the State Counter 500 of FIG. 9 are applied to a Binary Code to Decimal Converter Circuit 400. This circuit is enabled to decode its input signals from a binary 1 SCMUX1 COM signal generated from an Inverter 506 in FIG. 9. The output of Inverter 506 is merely the complement of the COM output of Multiplexer 502. Thus, it can be seen that when the COM output of Multiplexer 502 is a binary 0, inhibiting the Counter 500, the SCMUX1 $\overline{\text{COM}}$ signal is a binary 1 to enable the BCD to DEC CONV. 400 of FIG. 8. At each state count of the Counter 500, the Converter 400 decodes the SCQ1 through SCQ3 state outputs to generate one of four output signals designated ID (identification code) Dial 1 (the first dial reading) and a Next signal, indicating Dial readings 2 through 5 and State 6 (identifying State 6 of Counter 500). It will be noted in Decoder 400, that three outputs are provided designated 3, 5 and 7. These output signals correspond to states 3, 5 and 7 of the State Counter 500. It will also be noted, that the Decoder 400 generates a State 6 output signal representative of State 6 of Counter 500 to set a State 6 Latch 412. The purpose of the State 6 Latch 412 will subsequently be described.

Referring now back to the 3, 5 and 7 outputs of Decoder 400, those signals are provided to the input of an OR Gate 402. As can be seen in FIG. 8, OR Gate 402 is enabled to set a Decimal 1 (DEC.1) Latch 404 each time the State Counter 500 indicates a particular portion of the input message has been received. For example, when the ID code has been received, the ID signal from Converter 400 goes to a binary 1 to set Latch 404 via OR Gate 402. In a similar manner, when dial readings 1 through 5 are received, the Decode Latch 404 is also set. The Decode Latch Output is utilized to enable an AND Gate 406, which receives the DC8 pulse from the Data Clock Counter 108 of FIG. 5. Thus, for each word received in the message, AND Gate 406 is enabled at DC8 time to set a Decode Latch 2 (DEC.2) 408 to generate the aforementioned Decode signal.

The Decode signal is applied to an AND Gate 516 in FIG. 9 to aid in the generation of an Invalid Code Gate signal, the purpose of which will be subsequently described. Also, the Decode signal is applied to the clock input of the aforementioned Data Latch 120 of FIG. 5. By observing FIG. 5 and FIG. 8, it can be seen that the Decode signal is applied to the Data Latch 120 after the receipt of each 6 bits or word of the data message from the encoder. The Data Latch 120 functions to latch the inputs from the 6 Bit Shift Register 118 when the Decode signal makes a positive transition. When the Decode signal goes to a binary 0 or makes a negative transition, the latched outputs are removed and the input data from the 6 Bit Shift Register 118 is transferred to the latch outputs and held there, generating the PD0 through PD5 signals. As soon as the Decode signal goes back to a binary 1, those input bits from Register 118 are latched into the Data Latch to give positive stable addressing for the programmable read only memory devices included in FIGS. 10 and 7. The purpose of the PD0 through PD5 signals will subsequently be described. However, at this time it is advantageous to note that the PD0 through PD5 signals represent at any given time, a particular 6 bit portion of the message from the encoder. The 6 bit portions of course, being those as previously described in connection with FIG. 2 (ID code and dial 1 through dial 5 readings).

Reference is now made back to FIG. 8, where the generation of the Again L signal will be described. As shown in that figure, an Again Latch 416 is set by the aforementioned 6 Bits Signal generated by Gate 222 of FIG. 6. This signal is utilized to set the Again Latch to generate the Again L signal previously described for jamming the inputs into the State Counter 500 of FIG. 9 to set that counter to State 7. The Again Latch 416 is reset from the output of a BCD to Decimal Converter 414. It will be noted that Converter 414 generates a binary 1 output signal from a terminal designated 3 corresponding to State 3 of the State Counter 500. Thus, when the State 8 signal from the aforementioned Gate 508 of FIG. 9 is a binary 0, and the SCQ1 through SCQ3 signals designate State 3, the Again latch is reset to cause the Again L signal to go to a binary 0.

Reference is now made back to FIG. 5 to the output of the Data Flip Flop 114. As shown at the output of Flip Flop 114, the serialized encoder data is applied to a data (DA) input terminal of the 6 Bit Shift Register 118. That data is clocked into Register 118 by the aforementioned BCCL clock signal which is developed upon detection of the start of message (FIG. 6). As shown in FIG. 6, the BCCL signal is generated at DC4 time, which is the center bit time of each data bit coming from the meter encoder. Thus, the data bits are clocked into the 6 Bit Shift Register 118 in serial form. The first 6 data bits to be shifted into Register 118 are the encoder identification number (ID) bits (see FIG. 2). These 6 data bits are next clocked into the Data Latch 120 by the Decode signal from Latch 408 of FIG. 8 in the manner as previously described. It will be recalled that the Decode signal is generated in response to the generation of the ID signal by the State Counter 500 of FIG. 9 going to State 3. State 3 being that state which identifies the ID code of the message. Since the Decode signal has now gone to a binary 1, the identification code is latched in Latch 120 of FIG. 5 and the binary bit configuration of that code is applied on the output signal lines PD0–PD5 from the Data Latch 120.

Figure 7:
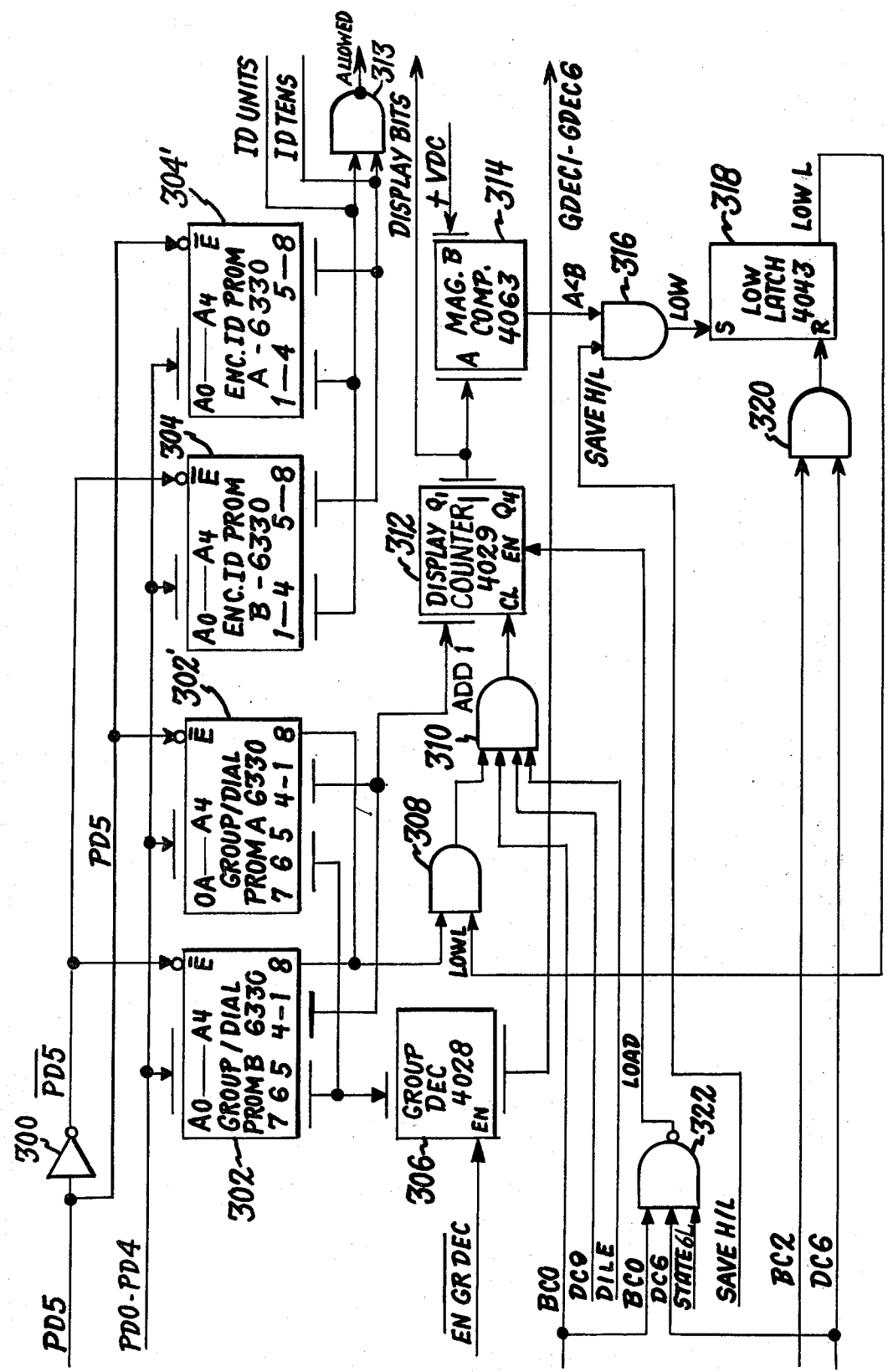

Reference is now made to FIG. 7, where the PD0 through PD4 identification code signals are applied to address inputs A0–A4 of each of a plurality of Group/Dial and Encoder Identification Programmable Read Only Memories (PROM's) 302, 302' and 304, 304'. PROM's 304 and 304' contain data information representative of the encoder identification numbers to be displayed on the identification display 56 as shown in FIGS. 13 and 11. The two PROM's 302 and 302' contain information representative of the aforementioned Groups 1 through 6 of which the encoder gears are divided into. Also, these two memories contain display bit information to be displayed on the Read-Out Display 58 of FIGS. 13 and 11 representative of the dial reading of each of the respective dials read from the encoder by the tester. The contents of PROMs 302 through 304 are shown in the appropriate appendices A through D.

The binary states of PD0 through PD4 data bits are utilized to address the memories 302 through 304 to extract information therefrom corresponding to either the identification code being received from the encoder or the group and dial information corresponding to the position of the dial being read from the encoder. The state of bit PD5 is utilized to determine which of two memories will be selected at any given time. For example, if the PD5 signal is a binary 0, that signal will enable memories 302' and 304' to be addressed to extract their data and put that data on their respective output lines. On the other hand, if the PD5 signal is a binary 1, that signal is inverted to a binary 0 through an Inverter 300 to apply a $\overline{PD5}$ signal to enable the addressing and reading of memories 302 and 304.

At this time, it is assumed that the ID code is being utilized to address one of the memories 304 or 304' depended upon the state of PD5. Assuming now that memory 304' is addressed, its output terminals 1 through 4 and 5 through 8 are applied to the input of a NAND Gate 313. As previously mentioned, there are four codes which are utilized in the present system as invalid codes. These codes are 111111, 111110, 011110 and 011111. The purpose of Gate 313 is to check the output codes coming from either one of the memories 304 to determine if that code is invalid. If an invalid code is presented to either one of the memories 304, a location in that memory is addressed to extract all binary 1's which will enable Gate 313 to generate a binary 0 Allowed output signal. Referring to FIG. 9, if the Allowed signal goes to a binary 0, as previously described, the output of the Multiplexer 502 likewise goes to a binary 0 to apply a binary 1 inhibit signal to the Counter 500 via NOR Gate 504. Should an invalid identification code be detected, this will inhibit the Counter 500 from progressing any further and the meter reader encoder tester of the present invention will halt.

However, if it is assumed that a valid code is read from the identification code PROM 304 or 304', Gate 313 will remain disabled, thus the Allowed signal will go to a binary 1 to allow the State Counter 500 to progress through its states in the manner as previously described.

Additionally, the generation of a binary 0 Allowed signal will turn on the Invalid Code light 50 as shown in FIGS. 9 and 13. This is explained by referring to FIGS. 8 and 9. In FIG. 9, at this time, the SCQ1 SCQ4 and COM signals to a NOR Gate 510 are all binary 0's, thus causing Gate 510 to generate a binary 1 INV CD INH signal which is applied as one input to an AND Gate 418, along with the binary 1 SCQ3 output from the State Counter 500 of FIG. 9. Gate 418 is now enabled to generate an Invalid Code Control signal out of an OR Gate 420. The Invalid Code Control signal from Gate 420 of FIG. 8 is applied to OR Gate 100 of FIG. 5 to reset the 60 Hz. Control Latch 102 and also provide a set pulse to set an Invalid Code Latch 518 of FIG. 9. Latch 518 is set via an AND Gate 516, which is now receiving the binary 1 Decode signal, the binary 1 Invalid Code Control signal and the DC9 pulse from the Data Clock Counter 108 of FIG. 5.

As soon as the Invalid Code Latch 518 sets, it generates an Invalid Code Latch (INV/CD L) signal which is applied to a Lamp Driver Circuit 520. The Lamp Driver circuit also receives the 2 Hz. clock signal as a Flash Clock from the Oscillator Clock 72 of FIG. 4 to cause the Invalid Code Lamp 50 to now blink on and off at a 2 Hz. rate indicating to the operator of the tester that an invalid code has been detected. The INV CD L signal of FIG. 9 is also applied to each of the Gates 505, 503 and 501. The binary 1 INV CD L signal now enables each of OR Gates 503 and 505, allowing the inputs J3 and J4 of Counter 500 to go to a binary 1. The binary 1 INV CD L signal also disables NOR Gate 501, which in turn enables Gate 507 to allow the 5760 Hz. clock to jam the J3 and J4 input signals into the State Counter. This sets the Counter to State 12 hanging it up in the manner as previously described when the Multiplexer 502' detected a count of State 12.

Let it now be assumed that a valid identification code has been received. Reference is now made to the ID units and ID tens output signals from the memories 304 and 304' of FIG. 7. The ID units and ID tens signals are applied to FIG. 11 to corresponding Decoder Driver Circuits 724 and 720. The ID Units and Tens units information is decimal information which is displayed on corresponding ID Display Units 726 and 722. Also, at this time the 6 Bits signal from FIG. 6 generates a binary signal to set a Display Ready Latch 700 which in turn generates a binary 1 output signal to enable a NAND Gate 702 to generate a $\overline{Display}$ binary 0 signal at BC1, DC1 time. The $\overline{Display}$ signal enables a Word Decoder 710 to decode the outputs of a Word Counter 708 at this time. The outputs of the Word Decoder 710 are decoded at outputs 0 and 3 through 5 by a Dial Select Latch 716 to generate an IDLE (identification latch and enable signal) at this time. The IDLE signal is applied to each of the ID Tens and Units Decode Drivers 720 and 724 to thus latch the identification code numbers into their respective displays 722 and 726. The IDLE signal also enables an AND Gate 706 to generate a binary 1 signal at DC5, BC2 time to increment the Word Counter 708 in preparation for receipt of subsequent bytes of data from the encoder. The identification number is now displayed on the ID Tens and Units Displays 722 and 726 of FIG. 11 (see FIG. 13).

The next Six Bits signal from Gate 222 of FIG. 6 now defines the first word after the identification code or dial 1 data. As shown in FIGS. 8 and 9, the Decode signal is produced from State 5 of the State Counter and the State Counter advances to State 6 in the manner as previously described. Also, as previously described, if either of the PROM's 304 or 304' indicate that an invalid code has been received, the Allowed signal from Gate 313 of FIG. 7 will go to a binary 0 to cause the Invalid Code Lamp 50 of FIG. 9 to flash and the reader will cease operation. However, assuming that a valid code is received, the State Counter advances to State 7 and waits for the next 6 Bits signal.

Reference is now made to FIG. 10 to the output of a NAND Gate 608 receiving as inputs DC9 and Bit Count Pulse BC1 which is enabled to generate a binary 0 enable Range Decode signal (EN.RNG.DEC). This latter signal is applied to an enable input of a Range Decoder 616 which receives the aforementioned range information stored in a Range PROM 612 now being addressed by PD0-PD4; The contents of the Range PROM 612 is shown in Appendix E. The output of Range PROM 612 is provided to a Range Latch 614, which is set by a binary 1 PD5 signal from the output of Data Latch 120 of FIG. 5. The output Ranges, R1-R6, of the Range Decode 616 are now loaded into a Range to Group Decode Logic Circuit 618 comprised of a plurality of NOR Gates to generate 1 of 6 group output signals $\overline{GRP1}$–$\overline{GRP6}$ which are applied to a Group Latch Circuit 620. The output of the Group Latch 620 provides signals GP1 through GP6 to a Group Comparator 622 where those signals will be later compared to Group Decode signals GDEC1-GDEC6 from the output of a Group Decoder 306 of FIG. 7.

Referring now to FIG. 8, the State 6 output from the Decoder 400 is now saved in a State 6 Latch designated 412 to generate a State 6L signal which is combined in FIG. 7 in a NAND Gate 322 with the BC0 and DC6 signals to generate a Load signal to enable a Display Counter 312. Enabling the Display Counter 312, now allows the Dial display information from the selected one of the Group/Dial PROMs 302 or 302' to be placed into the Display Counter 312. The dial display information now in the Display Counter 312 is compared in a Magnitude Comparator 314 with the +VDC to see if the dial information in Display Counter 312 is less than +VDC. This magnitude information (A<B) is stored in a Low Latch 318 via AND Gate 316. The other enable input to AND Gate 316 is a Save High Low (Save H/L) signal which is generated in FIG. 11 via a NAND Gate 704. Gate 704 is enabled by the now set Display Ready Latch output at BC2, DC9 time. The information stored in the Low Latch 318 of FIG. 7 will be used in the next dial reading to determine whether or not the next most significant dial's decimal value should be incremented in the ambiguous conversion areas (that is the overlap areas).

Referring now to FIG. 11, the $\overline{Display}$ signal is again produced at DC1, BC1 time since that gate is now enabled by the Display Ready Latch 700. This again enables the Word Decoder 710 to set a Dial Select Latch A 714 via its outputs 1 and 2 to generate a DILE output signal from the Q3 terminal of Latch 714. The DILE signal is applied to a latch enable (LE) input of the first Dial Decoder Driver Circuit 732 to thus latch the Display Bits or first dial information from the Display Counter 312 of FIG. 7 into the Decoder 732 for display on the Dial 1 Display 734. Also at this time, in FIG. 11, the Word signal from Gate 706 is again generated to increment the Word Counter 708.

The next 6 bits signal applied to the Multiplexer 502 of FIG. 9 (indicating that Dial 2 data is now at the output of Latch 120 of FIG. 5) now causes the Decode signal to again be produced from State 7 of the State Counter as indicated by the Next input signal to OR Gate 402 of FIG. 8. The Allowed signal into Multiplexer 502 (FIGS. 7 and 9) is checked in State 8 as previously described, and if Allowed is in a binary 1 state, the State Counter advances to State 11 (States 9 and 10 are bi-passed for timing) where the Multiplexer 502' checks at its 3 (State 11) input terminal to see if all dials have been read. At this time, since they have not, the State Counter is forced to jump back to State 7 where the State Counter waits for the next 6 Bits signal. The forcing of the State Counter to State 7 is controlled, as previously described, by the Again L signal which is jammed into the J1, 2 and 3 inputs of the State Counter 500 of FIG. 9. Referring to FIG. 10, an Enable Group Decode Latch 604 was previously set at DC4 time via a NAND Gate 600 to generate an Enable Group Decode Signal EN.GR. DEC from the Q output terminal of Latch 604. This latter signal is now applied to an enable input terminal of a Group Decode Circuit 306 of FIG. 7 to yield therefrom Group Decode signals GDEC1–GDEC6 by a decoding of the group output signals from terminals 5, 6 and 7 of the Group PROM 302. These Group Decode signals are now compared with the range information in the Group Comparator 622 of FIG. 10. In this comparator, if the Range/Group signals GP1–GP6 and GDEC1–GDEC6 yield a comparison, the output of the Group Comparator 622 goes to a binary 1 to disable a NOR Gate 624 so that a $\overline{DP}$ Flash Set signal from an AND Gate 606 (enabled at DC9 time with the Enable Group Decode Latch 604 set) can not be routed through NOR Gate 624 as a DP SEL.SW. signal to a control input of a Decimal Point Select Multiplexer 712 of FIG. 11.

Referring now to FIGS. 10 and 11, the DEP SEL SW signal from NOR Gate 624 will go to a binary 1 to let the $\overline{DP}$ Flash Set signal pass through to the control (C) input of the Decimal Point Select Multiplexer 712 if there is a non-comparison of the signals applied to the Group Decode Comparator 622. If there is a non comparison, the C input signal causes the Decode Multiplexer 712 to decode the outputs of the Word Counter 708 to in turn set the proper one of the stages Q1 through Q4 of a Decimal Latch 718. In this particular instance, since the decimal point to be flashed is between dials 1 and 2, the Decimal Point Latch 718 provides an output signal to a Decimal Point Drivers circuit 736, which selectively generates a DP1 signal to flash the decimal point light 60 on the Dial Display 734. The decimal point light 60 is caused to flash at a 2 Hz. rate by the 2 Hz. clock applied as a Flash Clock signal to the Decimal Point Drivers 736. Also, see FIG. 13 for a pictorial representation of where the DP1 signal causes the decimal point between the numerals 3 and 8 to be flashed. In FIG. 10, the Reset Group Compare signal (RST.GR COMP.) from NAND Gate 610 is produced at BC1, DC6 time to reset the Group Latch 620 in preparation to saving the range 2 dial information, now in Range Latch 614, upon the generation the Enable Range Decode signal (EN.RNG.DEC) generated at BC1, DC9 time from NAND Gate 608.

In FIG. 7, the Load signal from Gate 322 is again generated at BC0, DC6 time because of the binary 1 State 6 L signal to put the decimal data from the selected one of Group Dial PROMS 302 and 302' into the Display Counter 312. At this time, if the previous dial reading was low as indicated by the set state of the Low Latch 318, compared in Gate 308 with the Bit 8 output of PROMS 302 and 302', an Add 1 signal is produced from an AND Gate 310 at BC0, DC9 time to increment the Display Counter 312 by one. Gate 310 also receives the DILE signal from the Dial Select Latch 714 which is not a binary 1. The Display bits signals from the output of Counter 312 are now applied to the Dial 1 through Dial 5 Decode Driver circuits of FIG. 11 for display on the appropriate one of the Dial Displays 58.

As shown in FIG. 11, the $\overline{Display}$ signal is again generated as previously described to enable the Word Decoder 710 to yield a D2LE output signal from the Q2 output terminal of the Dial Select Latch 714, thus enabling the dial 2 information to be displayed on the Dial 2 Decimal Display not shown. The Word signal is also again generated at DC5 time to increment Counter 708. In FIG. 7, the Low Latch 318 is reset at BC2, DC6 time via an AND Gate 320. The Low Latch 318 is cleared at this time so that the magnitude comparator information from Dial 2 reading can be entered into the Low Latch 318 by the Save H/L signal produced at BC2, DC9 time from Gate 704 of FIG. 11.

The reader tester of the invention now proceeds as previously described to read Dials 3, 4 and 5 from the encoder. Referring to FIGS. 9 and 11, when the fifth dial is read a D5LE signal from the Q3 output of the Dial Select Latch 716 is provided which, as previously described, causes the State Counter via SCMUX2 502' of FIG. 9 to advance to State 12 after the data from dial 5 has been processed. The encoder reader tester logic will then remain with full display and/or trouble lamps flashing for as long as the Read Switch 14 of FIG. 4 is held in the read or closed position. It should also be noted that the Word Decoder 710 of FIG. 11 generates a binary 1 All Dials signal from the Bit 5 output of that decoder after the processing of the fifth dial information. This All Dials signal is applied to OR Gate 100 of FIG. 5 to reset the 60 Hz. Control Latch 102 to turn off the Inverter 18 in FIG. 4 and thus remove power from the encoder.

That which remains to be explained is the operation of the No Response Indicator Light 40 shown in FIGS. 9 and 13. This light is caused to flash if a message is not received from the encoder within a specified time after the Read Switch 14 has been activated to cause the encoder to read. This is explained as follows.

If an SOM signal is not applied to the State 2 input of the Multiplexer 502 of FIG. 9 before the aforementioned 250 ms window of FIG. 5 has closed, the No Response lamp will start flashing and the encoder reader of the present invention will cease further operation. Referring to an AND Gate 512 of FIG. 9, let it be assumed that the 250 ms window signal is a binary 1. The other inputs to Gate 512 are the COM output from Multiplexer 502 and outputs SCQ1, 2, 3 and 4 from the State Counter 500. The COM, SCQ1, SCQ3 and SCQ4 inputs to Gate 512 are applied through inverters, thus when those respective signals are binary 0's their respective inputs to Gate 512 are binary 1's. The SCQ2 input to Gate 512 is applied directly to that gate uninverted. Thus, it can be seen, that Gate 512 will be enabled if all of the inputs, except for SCQ2 and the 250 ms Window, are binary 0's and those latter two signals are binary 1's, the gate will be enabled to set a No Response Latch 514. As previously described, if an SOM signal is not received, the COM output of Multiplexer 502 will be a binary 0, thus holding an inhibit signal on the State Counter 500, preventing the state counter from advancing beyond State 2. Should the SOM signal not be received before the 250 ms window signal at the input of AND Gate 512 disappears, that gate will be enabled to set the No Response Latch 514 to generate a No Response L signal which is applied to the Lamp Drivers circuit 520 to cause the No Response Lamp 40 to flash by virtue of the 2 Hz. Flash Clock. The No Response L signal is also applied as one input to each of the Gates 501, 503 and 505 to cause the State Counter 500 to also be jammed to State 12 as previously described to thus stop the reader.

If the SOM sequence is found before the 250 ms window closes, Gate 512 will never be enabled and the State Counter will be allowed to advance to State 3 wherein the reader tester can proceed to take in data from the encoder, breaking the data into six bit bytes representative of the identification code and dial readings 1 through 5 as previously described. It is also significant to note, that an INV.CD.GT. signal is generated in FIG. 9 at this time by gate 512 and applied to OR Gate 100 of FIG. 5 to reset the 60 Hz. Control Latch 100 to turn off the encoder via inactivation of the Inverter 18 of FIG. 4.

While the present invention has been disclosed in connection with the preferred embodiment thereof, it should be understood that there may be other embodiments which fall within the spirit and scope of the invention as defined by the appended claims.

APPENDIX A
Program for Group PROM A

| DECIMAL ADDRESS | BIN. ADD. 4 (PD4) | 0 (PD0) | OUTPUTS 8 | 7 | 6 | 5 | 4 | 3 | 2 | 1 |
|---|---|---|---|---|---|---|---|---|---|---|
| 0 | 00000 | | 1 | 1 | 1 | 1 | 1 | 1 | 1 | 1 |
| 1 | 00001 | | 1 | 1 | 1 | 1 | 1 | 1 | 1 | 1 |
| 2 | 00010 | | 0 | 1 | 0 | 0 | 0 | 0 | 1 | 1 |
| 3 | 00011 | | 0 | 0 | 1 | 1 | 0 | 0 | 1 | 1 |
| 4 | 00100 | | 0 | 0 | 1 | 0 | 0 | 1 | 0 | 0 |
| 5 | 00101 | | 1 | 0 | 0 | 1 | 0 | 0 | 1 | 1 |
| 6 | 00110 | | 0 | 1 | 0 | 1 | 0 | 0 | 1 | 1 |
| 7 | 00111 | | 1 | 1 | 1 | 0 | 0 | 0 | 1 | 1 |
| 8 | 01000 | | 0 | 1 | 0 | 0 | 0 | 1 | 0 | 1 |
| 9 | 01001 | | 0 | 0 | 1 | 1 | 0 | 1 | 0 | 1 |
| 10 | 01010 | | 1 | 0 | 0 | 1 | 0 | 1 | 0 | 0 |
| 11 | 01011 | | 0 | 0 | 1 | 0 | 0 | 1 | 0 | 1 |
| 12 | 01100 | | 0 | 0 | 1 | 1 | 0 | 1 | 0 | 0 |
| 13 | 01101 | | 0 | 1 | 0 | 0 | 0 | 1 | 0 | 0 |
| 14 | 01110 | | 1 | 1 | 1 | 0 | 0 | 1 | 0 | 0 |
| 15 | 01111 | | 0 | 1 | 0 | 1 | 0 | 1 | 0 | 0 |
| 16 | 10000 | | 0 | 0 | 1 | 0 | 1 | 0 | 0 | 0 |
| 17 | 10001 | | 1 | 0 | 0 | 1 | 0 | 1 | 1 | 1 |
| 18 | 10010 | | 0 | 1 | 0 | 1 | 0 | 1 | 1 | 1 |
| 19 | 10011 | | 1 | 1 | 1 | 0 | 0 | 1 | 1 | 1 |
| 20 | 10100 | | 1 | 0 | 0 | 1 | 0 | 1 | 1 | 0 |
| 21 | 10101 | | 0 | 0 | 1 | 0 | 0 | 1 | 1 | 1 |
| 22 | 10110 | | 0 | 1 | 0 | 0 | 0 | 1 | 1 | 1 |
| 23 | 10111 | | 0 | 0 | 1 | 1 | 0 | 1 | 1 | 1 |
| 24 | 11000 | | 0 | 1 | 0 | 1 | 0 | 1 | 0 | 1 |
| 25 | 11001 | | 1 | 1 | 1 | 0 | 0 | 1 | 0 | 1 |
| 26 | 11010 | | 0 | 0 | 1 | 0 | 0 | 1 | 1 | 0 |
| 27 | 11011 | | 1 | 0 | 0 | 1 | 0 | 1 | 0 | 1 |
| 28 | 11100 | | 1 | 1 | 1 | 0 | 0 | 1 | 1 | 0 |
| 29 | 11101 | | 0 | 1 | 0 | 1 | 0 | 1 | 1 | 0 |
| 30 | 11110 | | 0 | 0 | 1 | 1 | 0 | 1 | 1 | 0 |
| 31 | 11111 | | 0 | 1 | 0 | 0 | 0 | 1 | 1 | 0 |

APPENDIX B
Program for Group PROM B

| DECIMAL ADDRESS | BIN. ADD. 4 (PD4) | 0 (PD0) | OUTPUTS 8 | 7 | 6 | 5 | 4 | 3 | 2 | 1 |
|---|---|---|---|---|---|---|---|---|---|---|
| 0 | 00000 | | 1 | 1 | 1 | 1 | 1 | 1 | 1 | 1 |
| 1 | 00001 | | 1 | 1 | 1 | 1 | 1 | 1 | 1 | 1 |
| 2 | 00010 | | 1 | 0 | 0 | 1 | 0 | 0 | 1 | 0 |
| 3 | 00011 | | 0 | 0 | 1 | 0 | 0 | 0 | 1 | 1 |
| 4 | 00100 | | 0 | 0 | 1 | 1 | 0 | 0 | 1 | 0 |
| 5 | 00101 | | 0 | 1 | 0 | 0 | 0 | 0 | 1 | 0 |
| 6 | 00110 | | 1 | 1 | 1 | 0 | 0 | 0 | 1 | 0 |
| 7 | 00111 | | 0 | 1 | 0 | 1 | 0 | 0 | 1 | 0 |
| 8 | 01000 | | 1 | 0 | 0 | 1 | 0 | 0 | 0 | 0 |
| 9 | 01001 | | 0 | 0 | 1 | 0 | 0 | 0 | 0 | 1 |
| 10 | 01010 | | 0 | 1 | 0 | 0 | 0 | 0 | 0 | 1 |
| 11 | 01011 | | 0 | 0 | 1 | 1 | 0 | 0 | 0 | 1 |
| 12 | 01100 | | 0 | 0 | 1 | 0 | 0 | 0 | 1 | 0 |
| 13 | 01101 | | 1 | 0 | 0 | 1 | 0 | 0 | 0 | 1 |
| 14 | 01110 | | 0 | 1 | 0 | 1 | 0 | 0 | 0 | 1 |
| 15 | 01111 | | 1 | 1 | 1 | 0 | 0 | 0 | 0 | 1 |
| 16 | 10000 | | 0 | 0 | 1 | 1 | 1 | 0 | 0 | 0 |
| 17 | 10001 | | 0 | 1 | 0 | 0 | 1 | 0 | 0 | 0 |
| 18 | 10010 | | 1 | 1 | 1 | 0 | 1 | 0 | 0 | 0 |
| 19 | 10011 | | 0 | 1 | 0 | 1 | 1 | 0 | 0 | 0 |
| 20 | 10100 | | 0 | 1 | 0 | 0 | 1 | 0 | 0 | 1 |
| 21 | 10101 | | 0 | 0 | 1 | 1 | 1 | 0 | 0 | 1 |
| 22 | 10110 | | 1 | 0 | 0 | 1 | 1 | 0 | 0 | 0 |
| 23 | 10111 | | 0 | 0 | 1 | 0 | 1 | 0 | 0 | 1 |
| 24 | 11000 | | 1 | 1 | 1 | 0 | 0 | 0 | 0 | 0 |

-continued

APPENDIX B
Program for Group PROM B

| DECIMAL ADDRESS | BIN. ADD. 4 (PD4) | 0 (PD0) | \| | OUTPUTS 8 | 7 | 6 | 5 | 4 | 3 | 2 | 1 |
|---|---|---|---|---|---|---|---|---|---|---|---|
| 25 | 11001 | | | 0 | 1 | 0 | 1 | 0 | 0 | 0 | 0 |
| 26 | 11010 | | | 0 | 0 | 1 | 1 | 0 | 0 | 0 | 0 |
| 27 | 11011 | | | 0 | 1 | 0 | 0 | 0 | 0 | 0 | 0 |
| 28 | 11100 | | | 0 | 1 | 0 | 1 | 1 | 0 | 0 | 1 |
| 29 | 11101 | | | 1 | 1 | 1 | 0 | 1 | 0 | 0 | 1 |
| 30 | 11110 | | | 0 | 0 | 1 | 0 | 0 | 0 | 0 | 0 |
| 31 | 11111 | | | 1 | 0 | 0 | 1 | 1 | 0 | 0 | 1 |

APPENDIX C
Program for ENC.ID PROM A

| DECIMAL ADDRESS | BIN. ADD. 4 (PD4) | 0 (PD0) | OUTPUTS 8 | 7 | 6 | 5 | 4 | 3 | 2 | 1 |
|---|---|---|---|---|---|---|---|---|---|---|
| 0 | 00000 | | 1 | 1 | 1 | 1 | 1 | 1 | 1 | 1 |
| 1 | 00001 | | 1 | 1 | 1 | 1 | 1 | 1 | 1 | 1 |
| 2 | 00010 | | 0 | 0 | 1 | 0 | 0 | 0 | 0 | 1 |
| 3 | 00011 | | 0 | 0 | 1 | 0 | 0 | 0 | 0 | 0 |
| 4 | 00100 | | 0 | 0 | 1 | 0 | 0 | 1 | 0 | 1 |
| 5 | 00101 | | 0 | 0 | 1 | 0 | 0 | 1 | 0 | 0 |
| 6 | 00110 | | 0 | 0 | 1 | 0 | 0 | 0 | 1 | 0 |
| 7 | 00111 | | 0 | 0 | 1 | 0 | 0 | 0 | 1 | 1 |
| 8 | 01000 | | 0 | 0 | 1 | 1 | 0 | 0 | 1 | 1 |
| 9 | 01001 | | 0 | 0 | 1 | 1 | 0 | 0 | 1 | 0 |
| 10 | 01010 | | 0 | 0 | 1 | 1 | 0 | 0 | 0 | 0 |
| 11 | 01011 | | 0 | 0 | 1 | 1 | 0 | 0 | 0 | 1 |
| 12 | 01100 | | 0 | 0 | 1 | 0 | 0 | 1 | 1 | 0 |
| 13 | 01101 | | 0 | 0 | 1 | 0 | 0 | 1 | 1 | 1 |
| 14 | 01110 | | 0 | 0 | 1 | 0 | 1 | 0 | 0 | 1 |
| 15 | 01111 | | 0 | 0 | 1 | 0 | 1 | 0 | 0 | 0 |
| 16 | 10000 | | 0 | 1 | 0 | 0 | 1 | 0 | 0 | 1 |
| 17 | 10001 | | 0 | 1 | 0 | 0 | 1 | 0 | 0 | 0 |
| 18 | 10010 | | 0 | 1 | 0 | 0 | 0 | 1 | 1 | 0 |
| 19 | 10011 | | 0 | 1 | 0 | 0 | 0 | 1 | 1 | 1 |
| 20 | 10100 | | 0 | 1 | 0 | 0 | 0 | 0 | 1 | 0 |
| 21 | 10101 | | 0 | 1 | 0 | 0 | 0 | 0 | 1 | 1 |
| 22 | 10110 | | 0 | 1 | 0 | 0 | 0 | 1 | 0 | 1 |
| 23 | 10111 | | 0 | 1 | 0 | 0 | 1 | 0 | 0 | 0 |
| 24 | 11000 | | 0 | 0 | 1 | 1 | 0 | 1 | 0 | 0 |
| 25 | 11001 | | 0 | 0 | 1 | 1 | 0 | 1 | 0 | 1 |
| 26 | 11010 | | 0 | 0 | 1 | 1 | 0 | 1 | 1 | 1 |
| 27 | 11011 | | 0 | 0 | 1 | 1 | 0 | 1 | 1 | 0 |
| 28 | 11100 | | 0 | 1 | 0 | 0 | 0 | 0 | 0 | 1 |
| 29 | 11101 | | 0 | 1 | 0 | 0 | 0 | 0 | 0 | 0 |
| 30 | 11110 | | 0 | 0 | 1 | 1 | 1 | 0 | 0 | 0 |
| 31 | 11111 | | 0 | 0 | 1 | 1 | 1 | 0 | 0 | 1 |

APPENDIX D
Program for ENC.ID PROM B

| DECIMAL ADDRESS | BIN. ADD. 4 (PD4) | 0 (PD0) | OUTPUTS 8 | 7 | 6 | 5 | 4 | 3 | 2 | 1 |
|---|---|---|---|---|---|---|---|---|---|---|
| 0 | 00000 | | 1 | 1 | 1 | 1 | 1 | 1 | 1 | 1 |
| 1 | 00001 | | 1 | 1 | 1 | 1 | 1 | 1 | 1 | 1 |
| 2 | 00010 | | 0 | 0 | 0 | 1 | 1 | 0 | 0 | 0 |
| 3 | 00011 | | 0 | 0 | 0 | 1 | 1 | 0 | 0 | 1 |
| 4 | 00100 | | 0 | 0 | 0 | 1 | 0 | 1 | 0 | 0 |
| 5 | 00101 | | 0 | 0 | 0 | 1 | 0 | 1 | 0 | 1 |
| 6 | 00110 | | 0 | 0 | 0 | 1 | 0 | 1 | 1 | 1 |
| 7 | 00111 | | 0 | 0 | 0 | 1 | 0 | 1 | 1 | 0 |
| 8 | 01000 | | 0 | 0 | 0 | 0 | 0 | 1 | 1 | 0 |
| 9 | 01001 | | 0 | 0 | 0 | 0 | 0 | 1 | 1 | 1 |
| 10 | 01010 | | 0 | 0 | 0 | 0 | 1 | 0 | 0 | 1 |
| 11 | 01011 | | 0 | 0 | 0 | 0 | 1 | 0 | 0 | 0 |
| 12 | 01100 | | 0 | 0 | 0 | 1 | 0 | 0 | 1 | 1 |
| 13 | 01101 | | 0 | 0 | 0 | 1 | 0 | 0 | 1 | 0 |
| 14 | 01110 | | 0 | 0 | 0 | 1 | 0 | 0 | 0 | 0 |
| 15 | 01111 | | 0 | 0 | 0 | 1 | 0 | 0 | 0 | 1 |
| 16 | 10000 | | 0 | 1 | 0 | 1 | 0 | 0 | 0 | 0 |
| 17 | 10001 | | 0 | 1 | 0 | 1 | 0 | 0 | 0 | 1 |
| 18 | 10010 | | 0 | 1 | 0 | 1 | 0 | 0 | 1 | 1 |
| 19 | 10011 | | 0 | 1 | 0 | 1 | 0 | 0 | 1 | 0 |
| 20 | 10100 | | 0 | 1 | 0 | 1 | 0 | 1 | 1 | 1 |
| 21 | 10101 | | 0 | 1 | 0 | 1 | 0 | 1 | 1 | 0 |
| 22 | 10110 | | 0 | 1 | 0 | 1 | 0 | 1 | 0 | 0 |
| 23 | 10111 | | 0 | 1 | 0 | 1 | 0 | 1 | 0 | 1 |
| 24 | 11000 | | 0 | 0 | 0 | 0 | 0 | 1 | 0 | 1 |
| 25 | 11001 | | 0 | 0 | 0 | 0 | 0 | 1 | 0 | 0 |
| 26 | 11010 | | 0 | 0 | 0 | 0 | 0 | 1 | 1 | 0 |
| 27 | 11011 | | 0 | 0 | 0 | 0 | 0 | 1 | 1 | 1 |
| 28 | 11100 | | 0 | 1 | 0 | 1 | 1 | 0 | 0 | 0 |
| 29 | 11101 | | 0 | 1 | 0 | 1 | 1 | 0 | 0 | 1 |
| 30 | 11110 | | 0 | 0 | 0 | 0 | 0 | 0 | 0 | 1 |
| 31 | 11111 | | 0 | 0 | 0 | 0 | 0 | 0 | 0 | 0 |

APPENDIX E
Program for Range PROM

| DECIMAL ADDRESS | BIN. ADD. 4 (PD4) | 0 (PD0) | OUTPUTS 8 | 7 | 6 | 5 | 4 | 3 | 2 | 1 |
|---|---|---|---|---|---|---|---|---|---|---|
| 0 | 00000 | | 1 | 1 | 1 | 1 | 1 | 1 | 1 | 1 |
| 1 | 00001 | | 1 | 1 | 1 | 1 | 1 | 1 | 1 | 1 |
| 2 | 00010 | | 0 | 0 | 1 | 0 | 0 | 0 | 1 | 0 |
| 3 | 00011 | | 0 | 0 | 1 | 0 | 0 | 0 | 1 | 0 |
| 4 | 00100 | | 0 | 0 | 0 | 1 | 0 | 0 | 1 | 1 |
| 5 | 00101 | | 0 | 0 | 1 | 0 | 0 | 0 | 1 | 0 |
| 6 | 00110 | | 0 | 0 | 1 | 0 | 0 | 0 | 1 | 0 |
| 7 | 00111 | | 0 | 0 | 1 | 0 | 0 | 0 | 1 | 0 |
| 8 | 01000 | | 0 | 0 | 0 | 1 | 0 | 0 | 1 | 1 |
| 9 | 01001 | | 0 | 0 | 0 | 1 | 0 | 0 | 1 | 1 |
| 10 | 01010 | | 0 | 0 | 0 | 1 | 0 | 0 | 1 | 1 |
| 11 | 01011 | | 0 | 0 | 0 | 1 | 0 | 0 | 1 | 1 |
| 12 | 01100 | | 0 | 0 | 0 | 1 | 0 | 0 | 1 | 1 |
| 13 | 01101 | | 0 | 0 | 0 | 1 | 0 | 0 | 1 | 1 |
| 14 | 01110 | | 0 | 0 | 0 | 1 | 0 | 0 | 1 | 1 |
| 15 | 01111 | | 0 | 0 | 0 | 1 | 0 | 0 | 1 | 1 |
| 16 | 10000 | | 0 | 1 | 0 | 1 | 0 | 1 | 0 | 1 |
| 17 | 10001 | | 0 | 1 | 0 | 1 | 0 | 1 | 0 | 1 |
| 18 | 10010 | | 0 | 1 | 0 | 1 | 0 | 1 | 0 | 1 |
| 19 | 10011 | | 0 | 1 | 0 | 1 | 0 | 1 | 0 | 1 |
| 20 | 10100 | | 0 | 1 | 1 | 0 | 0 | 1 | 0 | 0 |
| 21 | 10101 | | 0 | 1 | 1 | 0 | 0 | 1 | 0 | 0 |
| 22 | 10110 | | 0 | 1 | 0 | 1 | 0 | 1 | 0 | 1 |
| 23 | 10111 | | 0 | 1 | 1 | 0 | 0 | 1 | 0 | 0 |
| 24 | 11000 | | 0 | 0 | 0 | 1 | 0 | 0 | 1 | 1 |
| 25 | 11001 | | 0 | 1 | 1 | 0 | 0 | 1 | 0 | 0 |
| 26 | 11010 | | 0 | 1 | 1 | 0 | 0 | 1 | 0 | 0 |
| 27 | 11011 | | 0 | 1 | 1 | 0 | 0 | 1 | 0 | 0 |
| 28 | 11100 | | 0 | 1 | 1 | 0 | 0 | 1 | 0 | 0 |
| 29 | 11101 | | 0 | 1 | 1 | 0 | 0 | 1 | 0 | 0 |
| 30 | 11110 | | 0 | 1 | 1 | 0 | 0 | 1 | 0 | 0 |
| 31 | 11111 | | 0 | 1 | 1 | 0 | 0 | 1 | 0 | 0 |

What I claim as new and desire to secure by Letters Patent of the United States is:

1. In an automatic meter reading system of the type having a meter including gear train driven dials and including a readable encoder, for generating a serialized message consisting of dial readings, driven by said gear train whereby each gear in the gear train has a definite mechanical relationship to the other gears in the train, a method of determining the meter dial readings and checking for encoder generated errors by interdial checking the mechanical angular position between the respective dial drive gears of the gear train comprising the steps of:

(a) storing in a first addressable memory information representative of encoder dial readings;
(b) storing in a second memory information representative of ranges of angular positions of gears driving said dials;
(c) reading said encoder message;
(d) utilizing, as an address for said first and second memories, a first dial reading in said message to effect the retrieval from said first and second memories, respectively, a numerical value proportional to said first dial reading and information representative of the angular position of the gear driving said first dial;
(e) storing the angular position information retrieved from said second memory;
(f) utilizing, as an address for said first and second memories, a second dial reading in said message to effect the retrieval from said first and second memories respectively of a second numerical value proportional to said second dial reading and information representative of the angular position of the gear driving said second dial;
(g) storing the last angular position information retrieved from said memory;
(h) comparing the angular position information first retrieved from said second memory with the second numerical value retrieved from said first memory; and
(i) deriving an indication of an encoder interdial check failure when there is a non comparison.

2. The method in accordance with claim 1 further including the steps of displaying the numerical values retrieved from said first memory to give visual indications of said first and second dial readings.

3. The method in accordance with claim 1 wherein the step of reading said encoder message further includes the steps of detecting the start of a message and giving a visual indication of a non-received message if the start of a message is not detected within a prescribed time period.

4. The method in accordance with claim 1 further including the step of selecting one of a plurality of meter encoders to be tested prior to reading said encoder message.

5. The method in accordance with claim 1 further including the steps of checking the validity of each dial reading and giving a visual indication of an invalid reading when detected.

6. In an automatic meter reading system of the type having a meter including gear train driven dials and including a readable encoder, for generating a serialized message consisting of dial readings, driven by said gear train whereby each gear in the gear train has a definite mechanical relationship to the other gears in the train, apparatus for reading the dial readings and checking for encoder generated errors by the interdial checking of the mechanical angular positions between the respective dial drive gears of the gear train comprising:
(a) a first addressable memory for storing numerical information representative of encoder dial readings;
(b) decode means responsive to the numerical information retrieved from said first memory for selectively generating group decode signals defining groups of angular positions containing ranges for each of the dial drive gears;
(c) a second addressable memory for storing information representative of ranges of angular positions of the dial drive gears with designated ones of the ranges residing within prescribed ones of the groups defined by said decode means;
(d) means for selectively applying the dial readings in the message from said encoder to said first and second memories as address signals to effect the retrieval of the information stored therein;
(e) means for temporarily storing the range information retrieved from said second memory; and
(f) means for comparing the group decode signals from said decode means derived from a last received dial reading with the temporarily stored range information derived from the previously retrieved dial reading for generating a failure indication signal representative of an encoder interdial check failure when there is a non-comparison in the range information from the previously retrieved dial reading and the last retrieved dial reading.

7. The automatic meter reading system in accordance with claim 6 further including means selectively responsive to the numerical information retrieved from said first memory for displaying numerical values corresponding to the dial readings used to address said first memory.

8. The automatic meter reading system in accordance with claim 6 further including means for detecting the start of a message and giving a visual indication of a non-received message if the start of message is not detected within a prescribed time period.

9. The automatic meter reading system in accordance with claim 6 further including means for selecting one of a plurality of meter encoders to be tested.

10. The automatic meter reading system in accordance with claim 6 further including means for checking the validity of each dial reading and giving a visual indication of an invalid reading when detected.

* * * * *